(12) United States Patent
Kim et al.

(10) Patent No.: US 10,971,696 B2
(45) Date of Patent: Apr. 6, 2021

(54) DISPLAY DEVICE

(71) Applicant: LG Display Co., Ltd., Seoul (KR)

(72) Inventors: DongYoon Kim, Paju-si (KR); SeYeoul Kwon, Paju-si (KR); Moonsun Lee, Sejong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/709,053

(22) Filed: Dec. 10, 2019

(65) Prior Publication Data
US 2020/0203642 A1 Jun. 25, 2020

(30) Foreign Application Priority Data

Dec. 21, 2018 (KR) .................. 10-2018-0167755

(51) Int. Cl.
| | |
|---|---|
| *H01L 51/52* | (2006.01) |
| *H01L 27/32* | (2006.01) |
| *G06F 1/16* | (2006.01) |
| *G09F 9/30* | (2006.01) |
| *H01L 51/00* | (2006.01) |

(52) U.S. Cl.
CPC ........ *H01L 51/5237* (2013.01); *G06F 1/1652* (2013.01); *G09F 9/301* (2013.01); *H01L 27/3258* (2013.01); *H01L 51/524* (2013.01); *H01L 51/5246* (2013.01); *H01L 51/5256* (2013.01); *H01L 51/0097* (2013.01); *H01L 51/5243* (2013.01); *H01L 51/5253* (2013.01); *H01L 51/5281* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2011/0050657 A1* | 3/2011 | Yamada | H01L 51/5237 345/204 |
| 2016/0323994 A1* | 11/2016 | Kwon | G02F 1/133308 |
| 2018/0177046 A1 | 6/2018 | Wald et al. | |
| 2019/0067606 A1 | 2/2019 | Han et al. | |
| 2020/0205301 A1* | 6/2020 | Song | H05K 5/03 |
| 2020/0212132 A1* | 7/2020 | Kim | H01L 27/3258 |

FOREIGN PATENT DOCUMENTS

| | | |
|---|---|---|
| KR | 10-2018-0015226 A | 2/2018 |
| KR | 10-1888451 B1 | 8/2018 |

* cited by examiner

*Primary Examiner* — Steven B Gauthier
(74) *Attorney, Agent, or Firm* — Fenwick & West LLP

(57) ABSTRACT

A flexible display panel is disclosed. The flexible display panel includes a substrate and a pixel unit on a first surface of the substrate. An encapsulation layer is on the first surface of the substrate and covers the pixel unit. A support member is on a second surface of the substrate that is opposite the first surface. The support member overlaps an edge of the encapsulation layer. The support member reduces stress applied to areas of the flexible display panel that are vulnerable to cracking during bending of the flexible display panel.

34 Claims, 14 Drawing Sheets

DISPLAY DEVICE

CROSS-REFERENCE TO RELATED APPLICATIONS

This application claims the priority of Republic of Korea Patent Application No. 10-2018-0167755 filed on Dec. 21, 2018, the disclosure of which is incorporated herein by reference in its entirety.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a rollable display device which is manufactured by forming a display element and a wiring line on a flexible substrate such as plastic which is a flexible material so as to be capable of displaying images even though the display device is rolled is getting attention as a next generation display device.

SUMMARY

An object to be achieved by the present disclosure is to provide a display device which reduces a crack of the display device caused by the winding and unwinding by optimizing a neutral plane of the display device.

Another object to be achieved by the present disclosure is to provide a display device which reduces a stress which is applied to some components of a display panel vulnerable to an external force by lowering the neutral plane.

Still another object to be achieved by the present disclosure is to provide a display device which reduces a tensile stress applied to an area vulnerable to a crack while winding a display unit.

Objects of the present disclosure are not limited to the above-mentioned objects, and other objects, which are not mentioned above, can be clearly understood by those skilled in the art from the following descriptions.

Other detailed matters of the exemplary embodiments are included in the detailed description and the drawings.

According to the present disclosure, a stress is relieved in an area where the neutral plane of the display device is sharply changed to reduce the crack of the display panel.

According to the present disclosure, a modulus value and a thickness of a specific layer is adjusted in a portion of the display panel to easily adjust a position of the neutral plane formed on the display panel.

According to the present disclosure, the neutral plane is selectively moved from one portion of the display panel vulnerable to a tensile stress so that a compressive stress may act on a portion of the display panel, instead of the tensile stress.

According to the present disclosure, when the display unit is wound, damages of some components of the display panel which is formed of a material having a high hardness and a low malleability may be reduced.

In one embodiment, a flexible display panel comprises: a substrate having an active area that display an image and a non-active area that does not display the image; a pixel unit on a first surface of the substrate in the active area of the substrate, the pixel unit comprising a light emitting element; a pixel unit on a first surface of the substrate in the active area of the substrate, the pixel unit comprising a light emitting element; an encapsulation layer on the first surface of the substrate, the encapsulation layer covering the pixel unit and disposed in both the active area the non-active area of the substrate; and a support member on a second surface of the substrate that is opposite the first surface of the substrate, the support member overlapping an edge of the encapsulation layer in the non-active area without extending to the active area of the substrate.

In one embodiment, a rollable display device comprises a rollable display panel and a roller comprising an outer surface and an inner surface, the roller configured to roll the rollable display panel around the outer surface of the roller into a rolled state, and unroll the rollable display panel from the rolled state to an unrolled state. The rollable display panel includes: a substrate having an active area that display an image and a non-active area that does not display the image; a pixel unit on a first surface of the substrate in the active area of the substrate, the pixel unit comprising a light emitting element; an encapsulation layer on the first surface of the substrate, the encapsulation layer covering the pixel unit and disposed in both the active area the non-active area of the substrate; and a support member on a second surface of the substrate that is opposite the first surface of the substrate, the support member overlapping an edge of the encapsulation layer in the non-active area without extending to the active area of the substrate.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
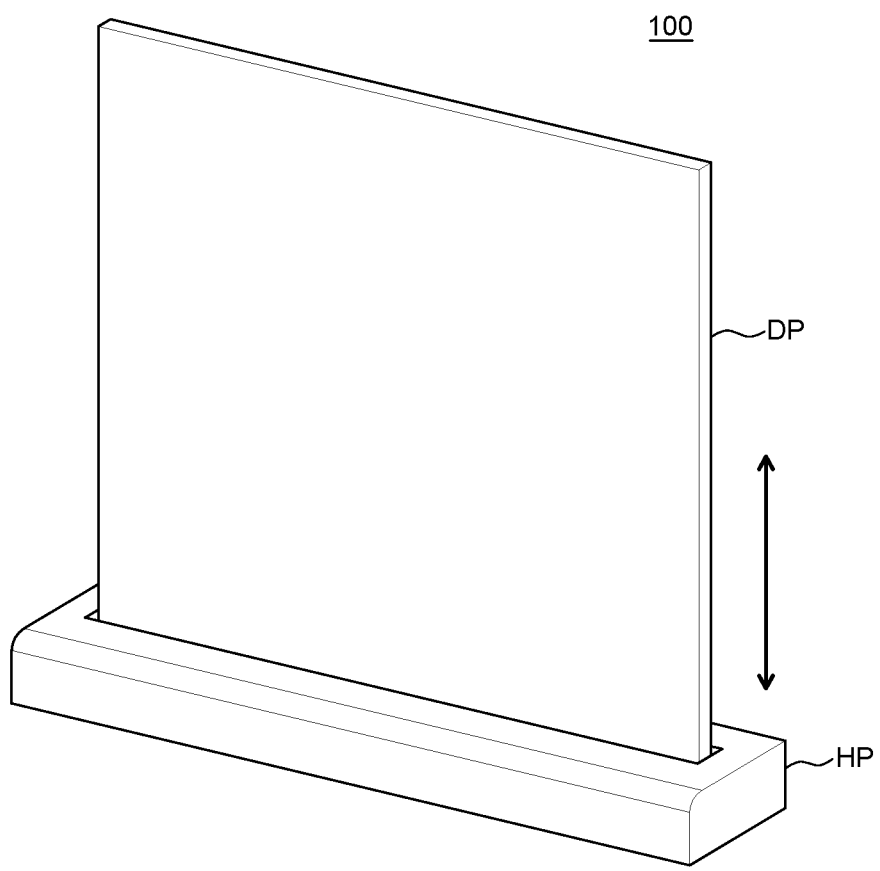
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

<Display Device-Rollable Display Device>

A rollable display device may also be referred to as a display device which is capable of displaying images even though the display device is rolled. The rollable display device may have a high flexibility as compared with a general display device of the related art. Depending on whether to use a rollable display device, a shape of the rollable display device may be freely varied. Specifically, when the rollable display device is not used, the rollable display device is rolled to be stored with a reduced volume. In contrast, when the rollable display device is used, the rolled rollable display device is unfolded to be used.

Figure 1B:
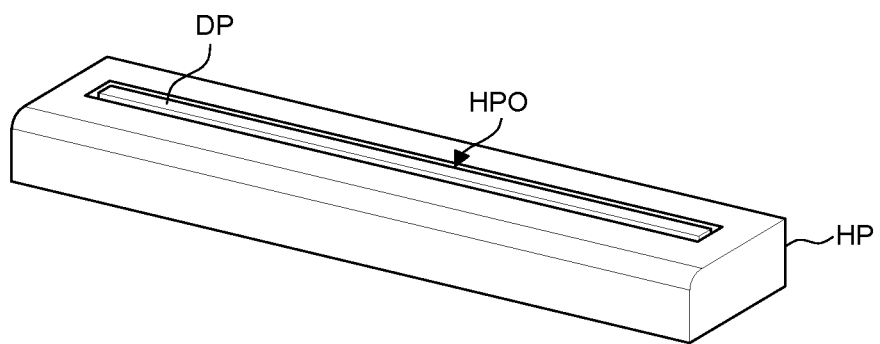

FIGS. 1A and 1B are perspective views of a display device according to an exemplary embodiment of the present disclosure. Referring to FIGS. 1A and 1B, a display device 100 according to an exemplary embodiment of the present disclosure includes a display unit DP and a housing unit HP where the display unit DP is a flexible display panel. In one embodiment, the display unit DP is rollable.

The display unit DP is a configuration for displaying images to a user and for example, in the display unit, a display element and a circuit, a wiring line, a component, and the like for driving the display element may be disposed. In this case, since the display device 100 according to an exemplary embodiment of the present disclosure is a rollable display device, the display unit DP may be configured to be wound and unwound. For example, the display unit DP may be formed of a display panel and a back cover each having flexibility to be wound or unwound. The display unit DP will be described below in more detail with reference to FIGS. 4 to 5B.

The housing unit HP is a case in which the display unit DP is accommodated.

The display unit DP may be wound to be accommodated in the housing unit HP and the display unit DP may be unwound to be disposed outside the housing unit HP.

The housing unit HP may have an opening HPO so that the display unit DP is rolled into the housing unit HP and out of the housing unit HP. The display unit DP may move in a vertical direction through the opening HPO of the housing unit HP.

In the meantime, the display unit DP of the display device 100 may be switched from a fully unwound state to a fully wound state or from a fully wound state to a fully unwound state.

FIG. 1A illustrates the display unit DP of the display device 100 which is fully unwound and in the fully unwound state, the display unit DP of the display device 100 is disposed outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user does not watch the images through the display device 100, if the display unit DP is not disposed at the outside of the housing unit HP, it is advantageous from the viewpoint of an outer appearance. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced and the display device 100 may be easily carried.

In the meantime, in order to switch the display unit DP to a fully unwound state or a fully wound state, a driving unit which winds or unwinds the display unit DP is disposed.

<Driving Unit>

Figure 2:
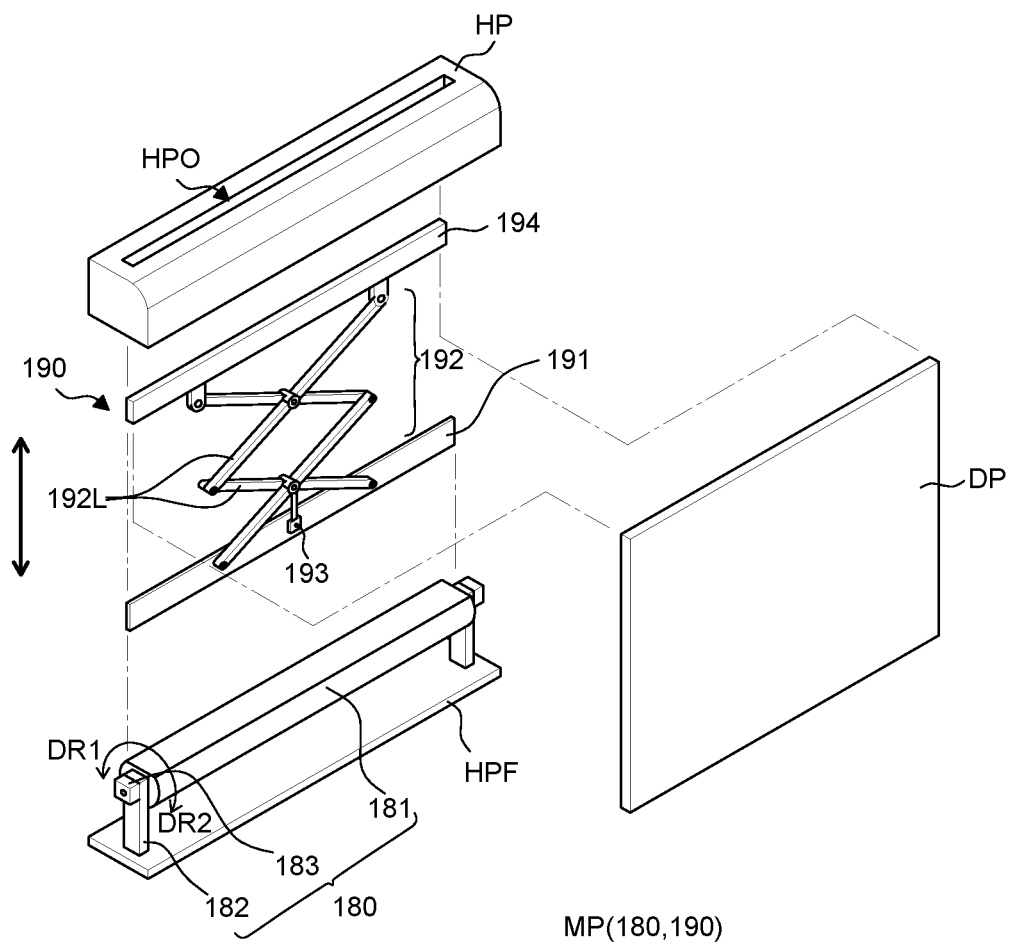
FIG. 2 is an exploded perspective view of a display device according to an exemplary embodiment of the present disclosure.
Figure 3:
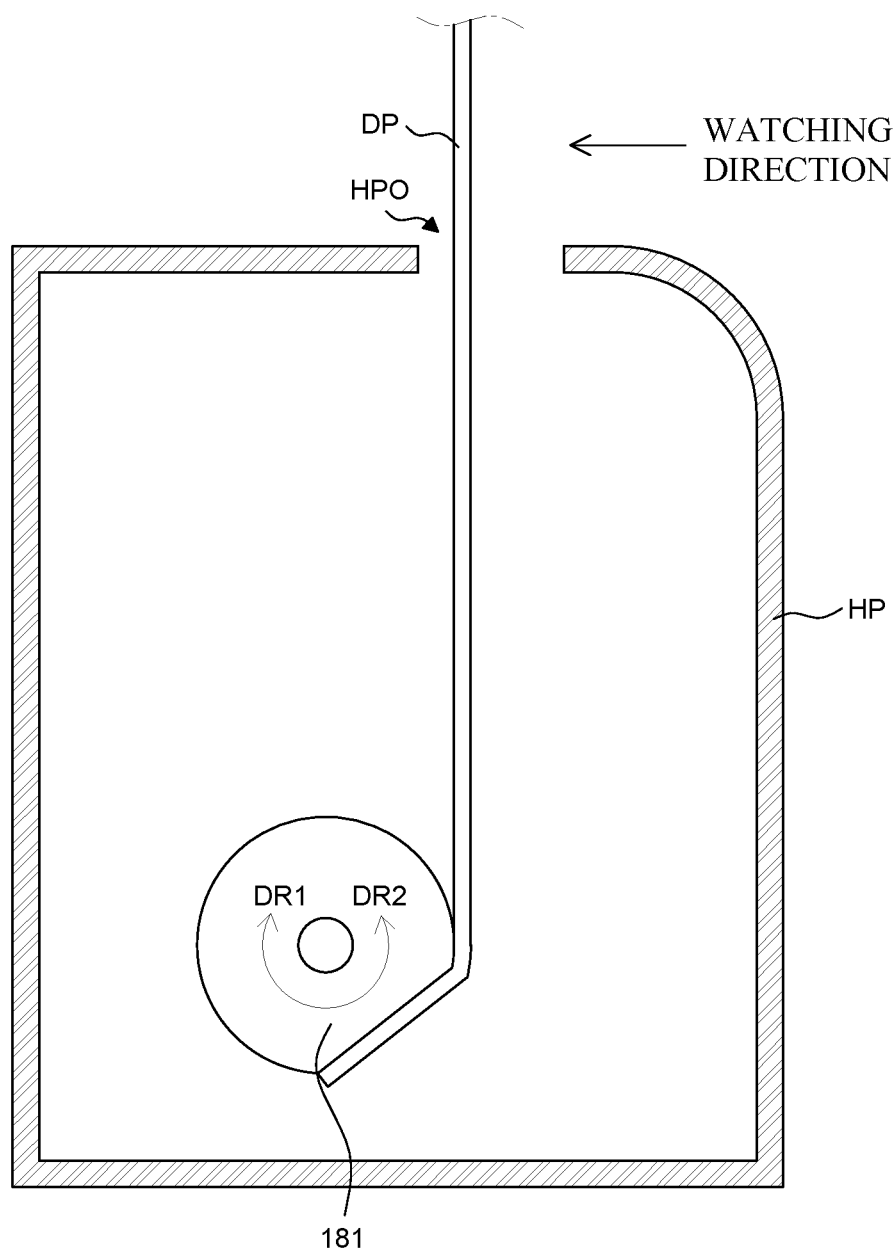
FIG. 3 is a schematic cross-sectional view for explaining a head bar and a display unit of a display device according to an exemplary embodiment of the present disclosure.

FIG. 2 is an exploded perspective view of a display device according to an exemplary embodiment of the present disclosure. FIG. 3 is a cross-sectional view of a display device according to an exemplary embodiment of the present disclosure. FIG. 3 is a schematic cross-sectional view for explaining a roller 181 and a display unit DP of a display device 100 according to an exemplary embodiment of the present disclosure. For the convenience of description, in FIG. 3, only a housing unit HP, a roller 181, and a display unit DP are illustrated.

First, referring to FIG. 2, a driving unit MP includes a roller unit 180 and a lifting unit 190.

The roller unit 180 may rotate in a first direction DR1 or a second direction DR2 and the display unit DP fixed to the roller unit 180 is wound or unwound to the roller unit 180 in accordance with the rotation of the roller unit 180. The roller unit 180 includes a roller 181, a roller support unit 182, and a roller rotating unit 183.

The roller 181 is a member around which the display unit DP is wound. A lower edge of the display unit DP may be fixed to the roller 181. When the roller 181 rotates, the display unit DP which is fixed to the roller 181 through the lower edge may be wound around the roller 181. In contrast, when the roller 181 rotates in an opposite direction, the display unit DP which is wound around the roller 181 may be unwound from the roller 181.

Referring to FIG. 3, the roller 181 may be formed to have a cylindrical shape in which at least a portion of an outer circumferential surface of the roller 181 is flat and the remaining portion of the outer circumferential surface is a curved surface. Even though the roller 181 may be entirely a cylindrical shape, but some portions may be formed of a flat surface. That is, a portion of an outer circumferential surface of the roller 181 is formed to be flat and the remaining portion of the outer circumferential surface is formed to be a curved surface. The flat portion of the roller 181 may be a portion in which the plurality of flexible films 150 and the printed circuit board 160 of the display unit DP are fully seated. However, the roller 181 may be a completely cylindrical shape or an arbitrary shape which may wind the display unit DP, but is not limited thereto.

The roller support units 182 support the roller 181 at both sides of the roller 181. Specifically, the roller support units 182 are disposed on a bottom surface HPF of the housing unit HP. Upper side surfaces of the roller support units 182 are coupled to both ends of the roller 181. Therefore, the roller support units 182 may support the roller 181 to be spaced apart from the bottom surface HPF of the housing unit HP. In this case, the roller 181 may be rotatably coupled to the roller support units 182.

The roller rotating units 183 may rotate the roller 181 in the first direction DR1 or the second direction DR2. Roller rotating units 183 may be disposed in a pair of roller support units 182. For example, the roller rotating units 183 may be rotary motors which transmit a torque to the roller 181, but are not limited thereto.

The lifting unit 190 moves the display unit DP in a vertical direction in accordance with the driving of the roller unit 180. The lifting unit 190 includes a link support unit 191, a link unit 192, a link lifting unit 193, and a head bar 194.

The link support unit 191 supports the link unit 192 and the link lifting unit 193. Specifically, the link support unit 191 may support the link unit 192 which move in the vertical direction so that the display unit DP does not collide with a boundary of the opening HPO of the housing unit HP. The link support unit 191 may support the link unit 192 and the display unit DP to move only in a vertical direction without moving in a forward and backward directions.

The link unit 192 may include a plurality of links 192L which is hinged with each other. The plurality of links 192L are rotatably hinged to each other to move in the vertical direction by the link lifting unit 193. When the link unit 192 moves in the vertical direction, the plurality of links 192L rotates to be as far away from each other as possible or as close to each other as possible.

The link lifting unit 193 moves the link unit 192 in the vertical direction. The link lifting unit 193 rotates the plurality of links 192L of the link unit 192 to be as close to each other as possible or rotates the plurality of links 192L to be as far away from each other as possible. The link lifting unit 193 lifts or lowers the link unit 192 to lift or lower the display unit DP connected to the link unit 192.

In this case, the link lifting unit 193 is driven to be synchronized with the roller rotating unit 183 so that the roller unit 180 and the lifting unit 190 may simultaneously operate. For example, when the display unit DP is switched from a fully unwound state to a fully wound state, the roller unit 180 operates to wind the display unit DP around the roller 181 and simultaneously with this, the lifting unit 190 operates to rotate the plurality of links 192L of the link unit 192 to lower the display unit DP. Further, when the display unit DP is switched from a fully wound state to a fully unwound state, the roller unit 180 operates to unwind the display unit DP from the roller 181 and simultaneously with this, the lifting unit 190 operates to rotate the plurality of links 192L of the link unit 192 to lift the display unit DP.

The head bar 194 of the lifting unit 190 is fixed to an uppermost end (e.g., topmost end) of the display unit DP. The head bar 194 is coupled to the link unit 192 to move the display unit DP in the vertical direction in accordance with the rotation of the plurality of links 192L of the link unit 192. That is, the display unit DP may move in a vertical direction by the head bar 194, the link unit 192, and the link lifting unit 193.

Hereinafter, a driving operation of the driving unit MP will be described in detail with reference to FIG. 3 together.

Referring to FIG. 3 together, a lower edge of the display unit DP is coupled to the roller 181. When the roller 181 rotates in the first direction DR1, that is, a clockwise direction, by the roller rotating unit 183, the display unit DP may be wound around the roller 181 so that a rear surface of the display unit DP is in close contact with a surface of the roller 181.

In contrast, when the roller 181 rotates in the second direction DR2, that is, a counter clockwise direction, by the roller rotating unit 183, the display unit DP wound around the roller 181 is unwound from the roller 181 to be disposed at the outside of the housing unit HP.

In some exemplary embodiments, a driving unit MP having a different structure other than the above-described driving unit MP may be applied to the display device 100. That is, as long as the display unit DP is wound and unwound, the above-described configuration of the roller unit 180 and the lifting unit 190 may be modified, some configuration may be omitted, or another configuration may be added.

<Display unit>

Figure 4:
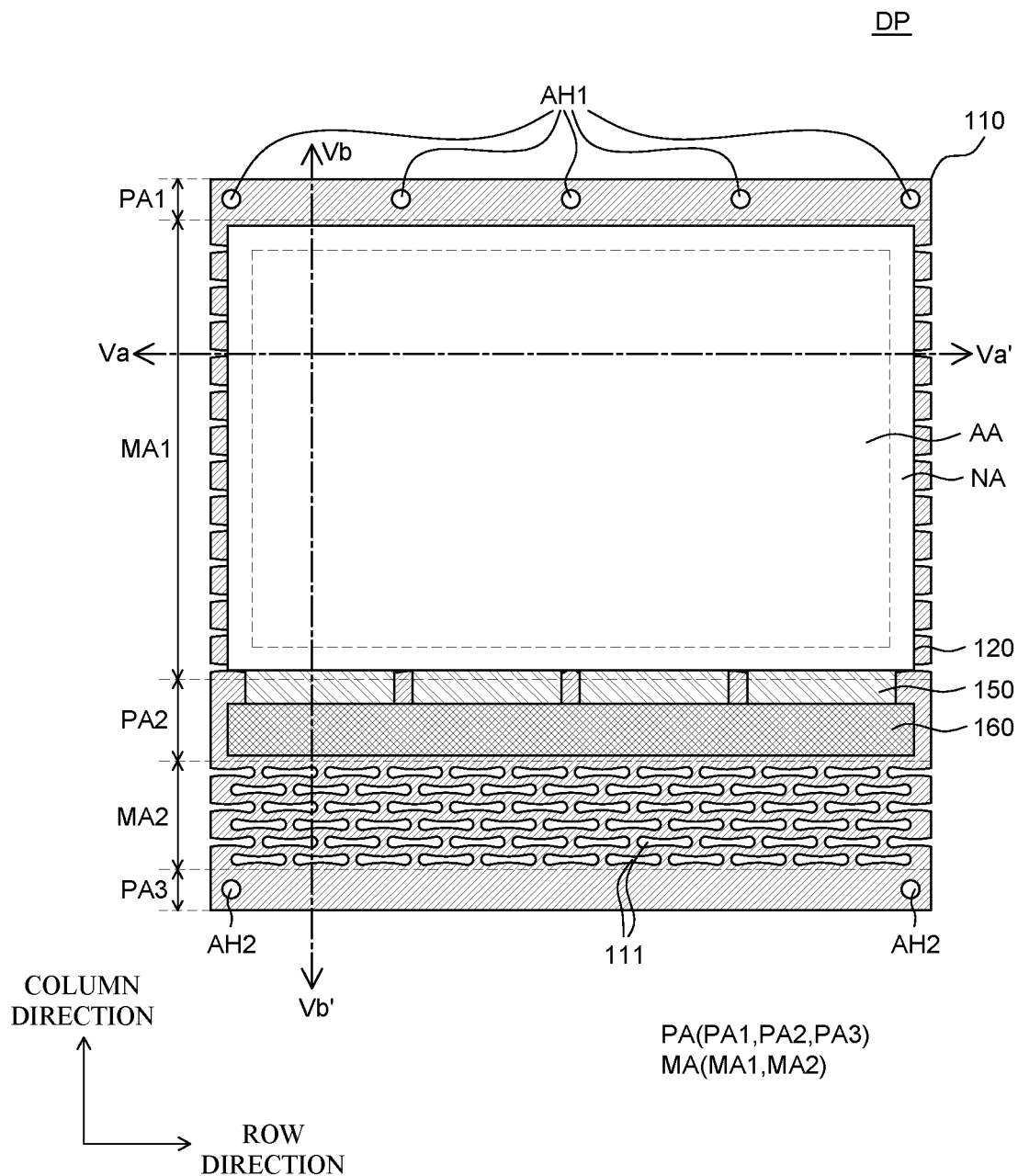
FIG. 4 is a cross-sectional view of a display device according to an exemplary embodiment of the present disclosure.
Figure 5A:
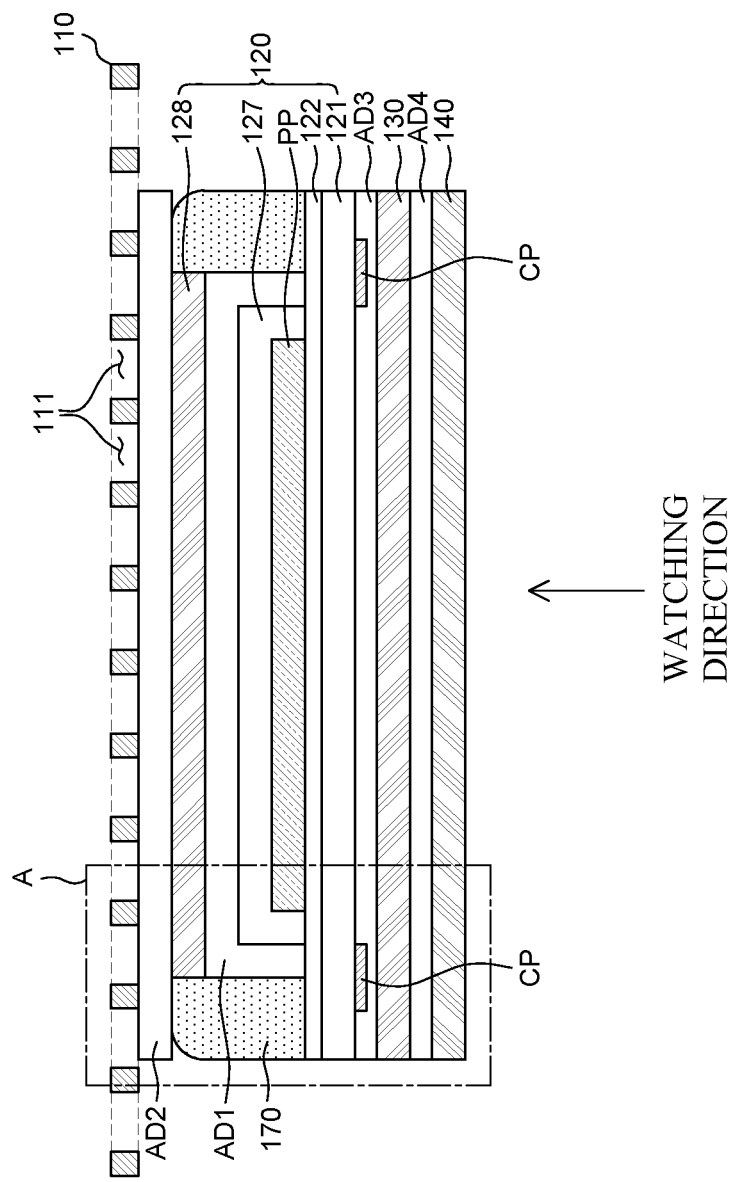
FIG. 5A is a cross-sectional view taken along the line Va-Va' of FIG. 4 according to an exemplary embodiment of the present disclosure.
Figure 5B:
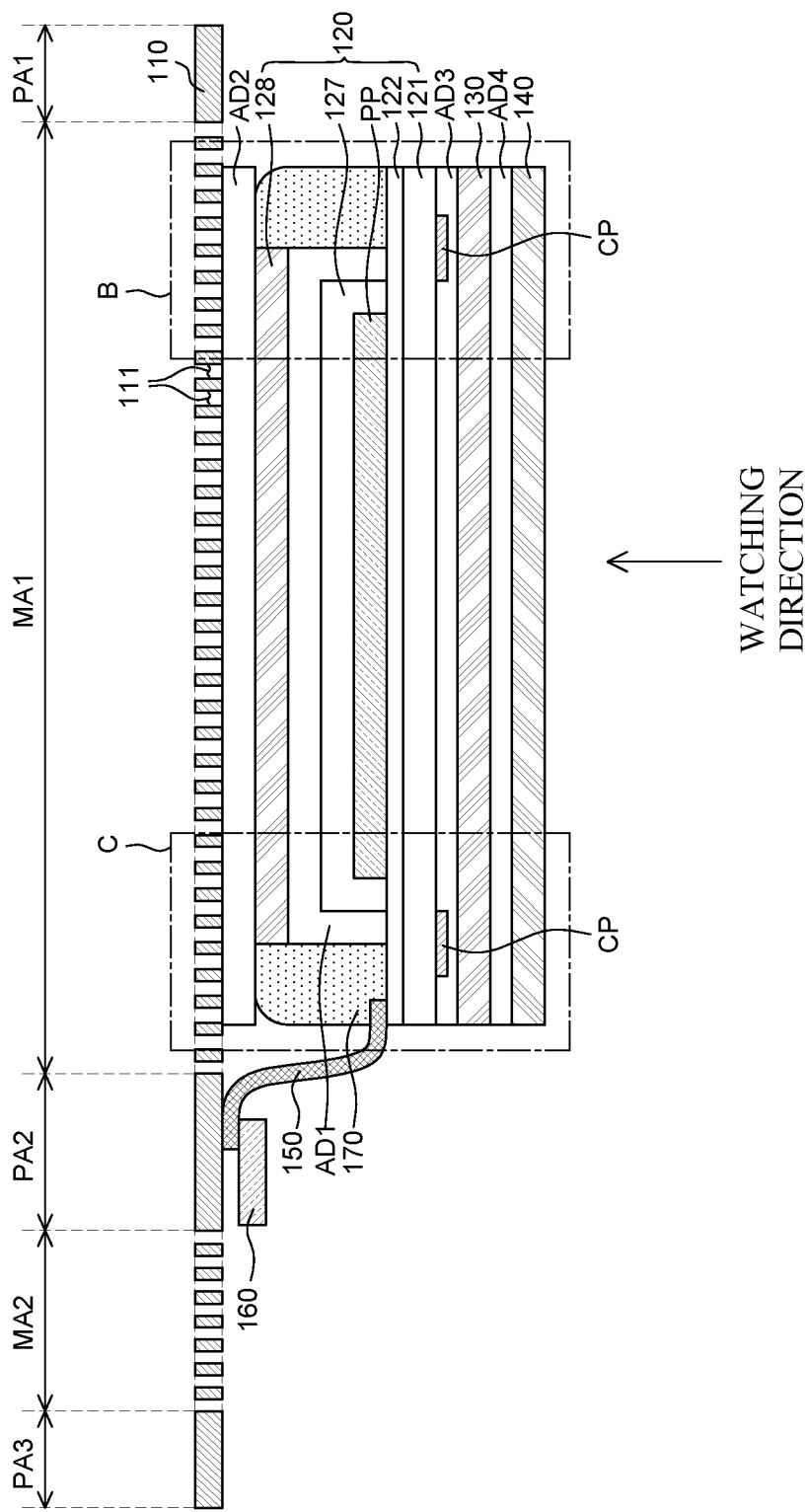
FIG. 5B is a cross-sectional view taken along Vb-Vb' of FIG. 4 according to an exemplary embodiment of the present disclosure.

FIG. 4 is a plan view of a display unit of a display device according to an exemplary embodiment of the present disclosure. FIG. 5A is a cross-sectional view taken along the line Va-Va' of FIG. 4. FIG. 5B is a cross-sectional view taken along Vb-Vb' of FIG. 4. Referring to FIGS. 4 to 5B, the display unit DP includes a back cover 110, a display panel 120, a barrier film 130, a polarizer 140, a plurality of flexible films 150, a printed circuit board 160, a seal member 170, and a support member CP. For the convenience of description, in FIG. 4, the barrier film 130, the polarizer 140, the seal member 170, and the support member CP are not illustrated and in FIGS. 5A and 5B, only a substrate 121, a buffer layer 122, a pixel unit PP, an encapsulating layer 127, and an encapsulating substrate 128 of the display panel 120 are illustrated.

Referring to FIGS. 4 to 5B, the back cover 110 is disposed on an upper surface of the display panel 120 to support the display panel 120, the plurality of flexible films 150, and the printed circuit board 160. A size of the back cover 110 may be larger than a size of the display panel 120. Further, the back cover 110 may protect other configurations of the display unit DP from the outside.

Even though the back cover 110 is formed of a material having a rigidity, at least a portion of the back cover 110 may have a flexibility to be wound or unwound together with the display panel 120. For example, the back cover 110 may be formed of a metal material such as steel use stainless or invar or plastic. However, if the material of the back cover 110 satisfies physical conditions such as a thermal strain amount, a radius of curvature, and a rigidity, the material may be diversely changed, and is not limited thereto.

The back cover 110 includes a plurality of support areas PA and a plurality of malleable areas MA. The plurality of support areas PA are areas where a plurality of openings 111 are not disposed and the plurality of malleable areas MA is areas where a plurality of openings 111 is disposed. Specifically, a first support area PA1, a first malleable area MA1, a second support area PA2, a second malleable area MA2, and a third support area PA3 are sequentially disposed from the uppermost end of the back cover 110. In this case, since the back cover 110 is wound or unwound in a column direction, the plurality of support areas PA and the plurality of malleable areas MA may be disposed along the column direction.

The first support area PA1 is an uppermost area of the back cover 110 and is fastened with the head bar 194. The first support area PA1 includes first fastening hole AH1 to be fastened with the head bar 194. For example, screws which pass through the head bar 194 and the first fastening holes AH1 are disposed to fasten the head bar 194 and the first support area PA1 of the back cover 110 with each other. As the first support area PA1 is fastened with the head bar 194, when the link unit 192 which is fastened with the head bar 194 is lifted or lowered, the back cover 110 is also lifted and lowered together with the display panel 120 which is attached to the back cover 110. Even though five first fastening holes AH1 are illustrated in FIG. 4, the number of first fastening holes AH1 is not limited thereto. Further, even though it is described that the back cover 110 is fastened with the head bar 194 using the first fastening holes AH1 in FIG. 4, it is not limited thereto and the back cover 110 and the head bar 194 may be fastened with each other without using a separate fastening hole.

The first malleable area MA1 is an area extending from the first support area PA1 to a lower side of the back cover 110. The first malleable area MA1 is an area in which a plurality of openings 111 is disposed and the display panel 120 is attached. Specifically, the first malleable area MA1 is an area which is wound around or unwound from the roller 181 together with the display panel 120. The first malleable area MA1 may overlap at least the display panel 120 among other configurations of the display unit DP.

The second support area PA2 extends from the first malleable area MA1 to the lower side of the back cover 110. A plurality of flexible film 150 which is connected to one end of the display panel 120 and a printed circuit board 160 are disposed in the second support area PA2.

In order to protect the plurality of flexible film 150 and the printed circuit board 160, the second support area PA2 may support the plurality of flexible film 150 and the printed circuit board 160 to be maintained to be flat without being curved in the roller 181.

Further, when the second support area PA2 is wound around the roller 181, a portion of the outer circumferential surface of the roller 181 which is in contact with the second support area PA2 may also be formed to be flat. Therefore, the second support area PA2 may maintain the flat state all the time regardless of the wound or unwound state to the roller 181 and the plurality of flexible films 150 and the printed circuit board 160 disposed in the second support area PA2 may also maintain the flat state.

The second malleable area MA2 is an area extending from the second support area PA2 to a lower side of the back cover 110. In the second malleable area MA2, a plurality of openings 111 is disposed and the second malleable area MA2 extends to dispose the display area AA of the display panel 120 at the outside of the housing unit HP. For example, when the back cover 110 and the display panel 120 are fully unwound, the third support area PA3 of the back cover 110 which is fixed to the roller 181 to the second support area PA2 to which the plurality of flexible film 150 and the printed circuit board 160 are attached may be disposed in the housing unit HP and the first malleable area MA1 to which the display panel 120 is attached may be disposed outside of the housing unit HP. In this case, when a length from the third support area PA3 fixed to the roller 181 to the second malleable area MA2 and the second support area PA2 is smaller than a length from the third support area PA3 to the opening HPO of the housing unit HP, a portion of the first malleable area MA1 to which the display panel 120 is attached may be disposed in the housing unit HP. Further, since a portion of the lower end of the display area AA of the display panel 120 is disposed in the housing unit HP, it may be difficult to watch images. Therefore, the length from the third support area PA3 fixed to the roller 181 to the second malleable area MA2 and the second support area PA2 may be designed to be equal to the length from the third support area PA3 fixed to the roller 181 to the opening HPO of the housing unit HP.

The third support area PA3 is an area extending from the second malleable area MA2 to the lower side of the back cover 110. The third support area PA3 is a lowermost area of the back cover 110 and is fastened with the roller 181. The third support area PA3 may include second fastening holes AH2 to be fastened with the roller 181. For example, screws which pass through the roller 181 and the second fastening holes AH2 are disposed to fasten the roller 181 and the third support area PA3 of the back cover 110 with each other. As the third support area PA3 is fastened with the roller 181, the back cover 110 may be wound around or unwound from the roller 181. Even though two second fastening holes AH2 are illustrated in FIG. 4, the number of second fastening holes AH2 is not limited thereto.

In the meantime, in the first support area PA1, the second support area PA2, and the third support area PA3, the plurality of openings 111 as formed in the plurality of malleable areas MA is not formed. Specifically, the first fastening hole AH1 and the second fastening hole AH2 are formed only in each of the first support area PA1 and the third support area PA3, but the plurality of openings 111 as formed in the plurality of malleable areas MA is not formed in the first support area PA1, the second support area PA2, and the third support area PA3. Further, the first fastening holes AH1 and the second fastening holes AH2 have different shapes from that of the plurality of openings 111. The first support area PA1 is an area fixed to the head bar 194 and the second support area PA2 is an area where the plurality of flexible films 150 and the printed circuit board 160 are supported. The third support area PA3 is an area fixed to the roller 181 so that it needs to have a rigidity larger than that of the plurality of malleable areas MA.

Specifically, as the first support area PA1, the second support area PA2, and the third support area PA3 have the rigidity, the first support area PA1 and the third support area PA3 may be firmly fixed to the head bar 194 and the roller 181. The second support area PA2 maintains the plurality of flexible films 150 and the printed circuit board 160 to be flat so as not to be curved, thereby protecting the plurality of flexible films 150 and the printed circuit board 160. Therefore, the display unit DP is fixed to the roller 181 and the head bar 194 of the driving unit MP to be moved to the inside or the outside of the housing unit HP depending on the operation of the driving unit MP and protect the plurality of flexible films 150 and the printed circuit board 160.

In the meantime, in FIG. 4, even though it is illustrated that the plurality of support areas PA and the plurality of malleable areas MA of back cover 110 are sequentially disposed along the column direction, when the back cover 110 is wound in the row direction, the plurality of support areas PA and the plurality of malleable areas MA may be sequentially disposed along a row direction.

In the meantime, when the display unit DP is wound or unwound, the plurality of openings 111 disposed in the plurality of malleable areas MA of the back cover 110 may be deformed by a stress which is applied to the display unit DP. Specifically, when the display unit DP is wound or unwound, the plurality of malleable areas MA of the back cover 110 may be deformed as the plurality of openings 111 contracts or expands. Further, as the plurality of openings 111 contracts or expands, a slip phenomenon of the display panel 120 disposed on the plurality of malleable areas MA of the back cover 110 is reduced so that the stress which is applied to the display panel 120 may be reduced.

When the display panel 120 and the back cover 110 are wound, a difference between a length of the display panel 120 which is wound around the roller 181 and a length of the back cover 110 which is wound around the roller 181 may be caused due to the difference of radii of curvature of the display panel 120 and the back cover 110. For example, when the back cover 110 and the display panel 120 are wound around the roller 181, a length of the back cover 110 required for wound around the roller 181 once may be different from a length of the display panel 120 required for being wound around the roller 181 once. That is, since the display panel 120 is disposed outer than the back cover 110 with respect to the roller 181, a length of the display panel 120 required to be wound around the roller 181 once may be larger than a length of the back cover 110 required to be wound around the roller 181 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel slides from the back cover 110 due to the stress and the difference of radii of curvature caused by the winding may be defined as a slip phenomenon. When the slip phenomenon is excessively increased, the display panel 120 may be detached from the back cover 110 or failures such as cracks may be caused.

In this case, in the display device 100 according to an exemplary embodiment of the present disclosure, even though the display unit DP is wound or unwound and a stress is applied to the display unit DP, the plurality of openings 111 of the back cover 110 is flexibly deformed to relieve the stress applied to the back cover 110 and the display panel 120. For example, when the back cover 110 and the display panel 120 are wound around the roller 181 along the column direction, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110. Further, the plurality of openings 111 is deformed during the process of winding the back cover 110 and the display panel 120 so that a stress which is applied to the display panel 120 from the back cover 110 may also be relieved.

Referring to FIG. 4, a plurality of flexible films 150 is disposed in the second support area PA2 of the back cover 110. The plurality of flexible films 150 is films in which various components are disposed on a base film having a malleability and supplies a signal to the plurality of sub pixels and the circuits which configure the plurality of pixels of the display area AA and is electrically connected to the display panel 120. One ends of the plurality of flexible films 150 are disposed in the non-display area NA of the display panel 120 to supply a power voltage or a data voltage to the plurality of sub pixels and the circuits of the display area AA. Even though the plurality of flexible films 150 is four in FIG. 4, the number of flexible films 150 may vary depending on the design and is not limited thereto.

In the meantime, a driving IC such as a gate driver IC or a data driver IC may be disposed on the plurality of flexible films 150. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is described that the driving IC is mounted on the plurality of flexible films 150 by a chip on film technique, but is not limited thereto.

Referring to FIG. 4, the printed circuit board 160 is disposed in the second support area PA2 of the back cover 110 to be connected to the plurality of flexible films 150. The printed circuit board 160 is a component which supplies signals to the driving IC. Various components may be disposed in the printed circuit board 160 to supply various signals such as a driving signal or a data signal to the driving IC. For example, a timing controller 181 or a power source unit may be disposed on the printed circuit board 160. In the meantime, even though one printed circuit board 160 is illustrated in FIG. 4, the number of printed circuit boards 160 may vary depending on the design and is not limited thereto.

In the meantime, even though not illustrated in FIG. 4, an additional printed circuit board which is connected to the printed circuit board 160 may be further disposed. For example, the printed circuit board 160 may be referred to as a source printed circuit board (S-PCB) on which the data driver MP is mounted and the additional printed circuit board connected to the printed circuit board 160 may be referred to as a control printed circuit board (C-PCB) in which the timing controller is mounted. The additional printed circuit board may be disposed in the roller 181 or disposed in the housing unit HP at the outside of the roller 181, or disposed to be in direct contact with the printed circuit board 160.

Referring to FIG. 4, the display panel 120 is disposed in the first malleable area MA1 of the back cover 110. The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to an exemplary embodiment of the present disclosure is a rollable display device, the display panel 120 may be implemented as a flexible display panel to be wound around or unwound from the roller 181.

Referring to FIG. 4, the display panel 120 includes a display area AA and a non-display area NA.

The display area AA is an area where images are displayed in the display panel 120. In the display area AA, a plurality of sub pixels which configures the plurality of pixels and a circuit for driving the plurality of sub pixels may be disposed. The plurality of sub pixels is minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be formed of a thin film transistor, a storage capacitor, a gate line, and a data line, but is not limited thereto.

The non-display area NA is an area where no image is displayed. In the non-display area NA, various wiring lines and circuits for driving the organic light emitting diode of the display area AA are disposed. For example, in the non-display area NA, a link line which transmits signals to the plurality of sub pixels and circuits of the display area AA or a driving IC such as a gate driver IC or a data driver IC may be disposed, but the non-display area is not limited thereto.

Referring to FIGS. 5A and 5B, the display panel 120 includes a substrate 121, a buffer layer 122, a pixel unit PP, an encapsulation layer 127, and an encapsulation substrate 128.

The substrate 121 which is a base member for supporting various components of the display panel 120 may be configured by an insulating material. The substrate 121 may be formed of a material having flexibility to which the display panel 120 is wound or unwound. For example, the substrate 121 may be formed of a plastic material such as polyimide. In one embodiment, the substrate 121 has a display area (e.g., an active area) for displaying an image and a non-display area (e.g., a non-active area) that does not display the image as will be further described below.

A buffer layer 122 is disposed on an upper surface of the substrate 121. The buffer layer 122 suppress moisture and/or oxygen which is permeated from the outside of the substrate 121 from being diffused. The buffer layer 122 may be formed of an inorganic material, for example, may be configured by a single layer or a double layer of silicon oxide SiOx and silicon nitride SiNx, but is not limited thereto.

The pixel unit PP is disposed on the upper surface of the substrate 121 and the buffer layer 122. The pixel unit PP includes a plurality of organic light emitting diodes and a circuit for driving the plurality of organic light emitting diodes. The pixel unit PP may be disposed so as to correspond to the display area AA. The organic light emitting diode and the circuit for driving the organic light emitting diode will be described in detail with reference to FIGS. 6A to 6C.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material to allow the light emitted from the organic light emitting diode to travel to the lower portion of the substrate 121 and the cathode may be formed of the metal material having a high reflectivity.

Hereinafter, for the convenience of description, the description will be made by assuming that the display device 100 according to an exemplary embodiment of the present disclosure is a bottom emission type display device, but it is not limited thereto.

The encapsulating layer 127 is disposed to cover the pixel unit PP. The encapsulation layer 127 closely seals the organic light emitting diode of the pixel unit PP. The encapsulation layer 127 may protect the organic light emitting diode of the pixel unit PP from moisture, oxygen, and impacts of the outside. The encapsulation layer 127 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulation substrate 128 is disposed on the encapsulation layer 127.

Specifically, the encapsulation substrate 128 is disposed between the encapsulation layer 127 and the back cover 110. The encapsulation substrate 128 protects the organic light emitting diode of the pixel unit PP together with the encapsulation layer 127. The encapsulation substrate 128 may protect the organic light emitting diode of the pixel unit PP from moisture, oxygen, and impacts of the outside. The encapsulation substrate 128 may be formed of a metal material, which has a high corrosion resistance and is easily processed in the form of foil or thin film, such as aluminum (Al), nickel (Ni), chromium (Cr), and an alloy material of iron (Fe) and nickel. Therefore, as the encapsulation substrate 128 is formed of a metal material, the encapsulation substrate 128 may be implemented as an ultra-thin film and have a high resistance against external impacts and scratches.

A first adhesive layer AD1 may be disposed between the encapsulation layer 127 and the encapsulation substrate 128. The first adhesive layer AD1 may bond the encapsulation layer 127 and the encapsulation substrate 128 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed to enclose the encapsulation layer 127 and the pixel unit PP. That is, the pixel unit PP may be sealed by the buffer layer 122 and the encapsulation layer 127 and the encapsulation layer 127 and the pixel unit PP may be sealed by the buffer layer 122 and the first adhesive layer AD1. The first adhesive layer AD1 may protect the organic light emitting diode of the pixel unit PP from moisture, oxygen, and impacts of the outside together with the encapsulation layer 127 and the encapsulation substrate 128. In this case, the first adhesive layer AD1 may further include an absorbent. The absorbent may be particles having hygroscopicity and absorb moisture and oxygen from the outside to reduce permeation of the moisture and oxygen into the pixel unit PP.

A second adhesive layer AD2 is disposed between the encapsulation substrate 128 and the back cover 110. The second adhesive layer AD2 may bond the encapsulation substrate 128 and the back cover 110 to each other. The second adhesive layer AD2 is formed of a material having adhesiveness and may be a thermosetting or natural curing adhesive. For example, the second adhesive layer AD2 may be formed of an optical clear adhesive (OCA) or a pressure sensitive adhesive (PSA), but is not limited thereto.

Even though in FIGS. 4 to 5B, it is illustrated that the plurality of openings 111 of the back cover 110 is not filled with the second adhesive layer AD2, the second adhesive layer AD2 may be filled in a portion or all of the plurality of openings 111 of the back cover 110. If the second adhesive layer AD2 is filled inside the plurality of openings 111 of the back cover 110, a contact area between the second adhesive layer AD2 and the back cover 110 is increased so that a separation phenomenon between the second adhesive layer AD2 and the back cover 110 may be avoided.

Referring to FIGS. 5A and 5B, the seal member 170 is disposed to enclose the side surface of the display panel 120 and the support member CP, the barrier film 130, and the polarizer 140 are disposed on the rear surface of the display panel 120. As shown in FIGS. 5A and 5B, the sealing member 170 surrounds the encapsulation layer 127.

The barrier film 130 is disposed on the rear surface of the display panel 120. That is, the barrier film 130 is disposed on the rear surface of the substrate 121 of the display panel 120. The barrier film 130 is disposed below the display panel 120 to protect the display panel 120 from the moisture, oxygen, impact, and the like. The barrier film 130 may transmit the light emitted from the pixel unit PP of the display panel 120 and may be formed of a flexible transparent film which is wound or unwound to the roller 181 together with the display panel 120. For example, the barrier film 130 may be formed of cyclic olefin polymer (COP) having optical isotropy to suppress the degradation of outdoor visibility due to phase difference disturbance between the polarizer 140 and the barrier film 130. However, it is not limited thereto and may be formed of a material such as polyimide (PI), polycarbonate (PC), and polyethylene terephthalate (PET).

A third adhesive layer AD3 is disposed between the substrate 121 and the barrier film 130. The third adhesive layer AD3 may bond the substrate 121 of the display panel 120 and the barrier film 130. The third adhesive layer AD3 is formed of a material having adhesiveness and may be a thermosetting or natural curable type adhesive. For example, the third adhesive layer AD3 may be formed of an optical clear adhesive (OCA), a pressure sensitive adhesive (PSA), or the like, but is not limited thereto.

The polarizer 140 is disposed on the rear surface of the barrier film 130. The polarizer 140 selectively transmits light to reduce the reflection of external light which is incident onto the display panel 120. Specifically, the display panel 120 includes various metal materials applied to the semiconductor element, the wiring line, the organic light emitting diode, and the like. Therefore, the external light incident onto the display panel 120 may be reflected from the metal material so that the visibility of the display device 100 may be reduced due to the reflection of the external light. However, when the polarizer 140 is disposed, the polarizer 140 suppress the reflection of the external light so that the outdoor visibility of the display device 100 may be increased. In this case, as described above, the barrier film 130 is also formed to have the optical isotropy so that the barrier film 130 may transmit the external light as it is without causing phase delay. Further, the polarizer 140 blocks the external light which transmits the barrier film 130 without causing the phase delay to be incident onto the polarizer 140 so as not to be emitted to the outside of the display device 100. However, the polarizer 400 may be omitted depending on an implementation example of the display device 100.

A fourth adhesive layer AD4 is disposed between the barrier film 130 and the polarizer 140. The fourth adhesive layer AD4 may bond the barrier film 130 and the polarizer 140 to each other. The fourth adhesive layer AD4 is formed of a material having an adhesiveness and may be a thermosetting or natural curing adhesive. For example, the fourth adhesive layer AD4 may be formed of an optical clear adhesive (OCA), a pressure sensitive adhesive (PSA), or the like, but is not limited thereto.

The seal member 170 is disposed so as to enclose a portion of the side surface of the display panel 120. The seal member 170 may reduce the moisture transmission through the side portion of the display panel 120. Specifically, the seal member 170 may be disposed to be in contact with the upper surface of the buffer layer 122 outwardly protruding from the pixel unit PP, a side surface of the first adhesive layer AD1, a side surface of the encapsulation substrate 128, and a lower surface of the second adhesive layer AD2. Further, referring to FIG. 5B, the seal member 170 may be disposed to cover one end of the flexible film 150 disposed on the upper surface of the substrate 121 and the buffer layer 122. The seal member 170 is disposed so as to cover the side surface of the display panel 120 to form a ring shape corresponding to the shape of the display panel 120 in a plan view, but is not limited thereto. For example, the seal member 170 may be formed of a curable material having a Young's modulus value of 50 MPa to 200 MPa. Further, the seal member 170 may be formed of an acryl, urethane, and silicon based curable material, but is not limited thereto.

In the meantime, referring to FIGS. 5A and 5B, the support member CP is disposed between the substrate 121 and the third adhesive layer AD3. The support member CP may be disposed on the rear surface of the substrate 121 to overlap the edge of the encapsulation substrate 128. When the display unit DP is wound or unwound to the roller 181, the support member CP may relieve a stress amount applied to the entire surface of the display panel 120 depending on whether the encapsulation substrate 128 is provided or not so that the stress amount is not sharply changed. By doing this, the crack of the display panel 120 may be reduced. Specifically, when the display unit DP is wound, the encapsulation substrate 128 has a material having rigidity, so that the resistance against the winding may be high. Therefore, a stress which is applied to a partial area of the display panel 120 on which the encapsulation substrate 128 is disposed may be larger than a stress which is applied to the remaining area of the display panel 120 on which the encapsulation substrate 128 is not disposed. Therefore, when the display unit DP is wound, the amount of the stress which is applied to the display panel 120 in the vicinity of the edge of the encapsulation substrate 128 may be sharply changed. Therefore, the support member CP relieves the stress which is sharply changed in the vicinity of the edge of the encapsulation substrate 128 to reduce the crack of the display panel 120.

Hereinafter, the support member CP and the pixel unit PP will be described in more detail with reference to FIGS. 6A to 6C.

<Support Member>

Figure 6A:
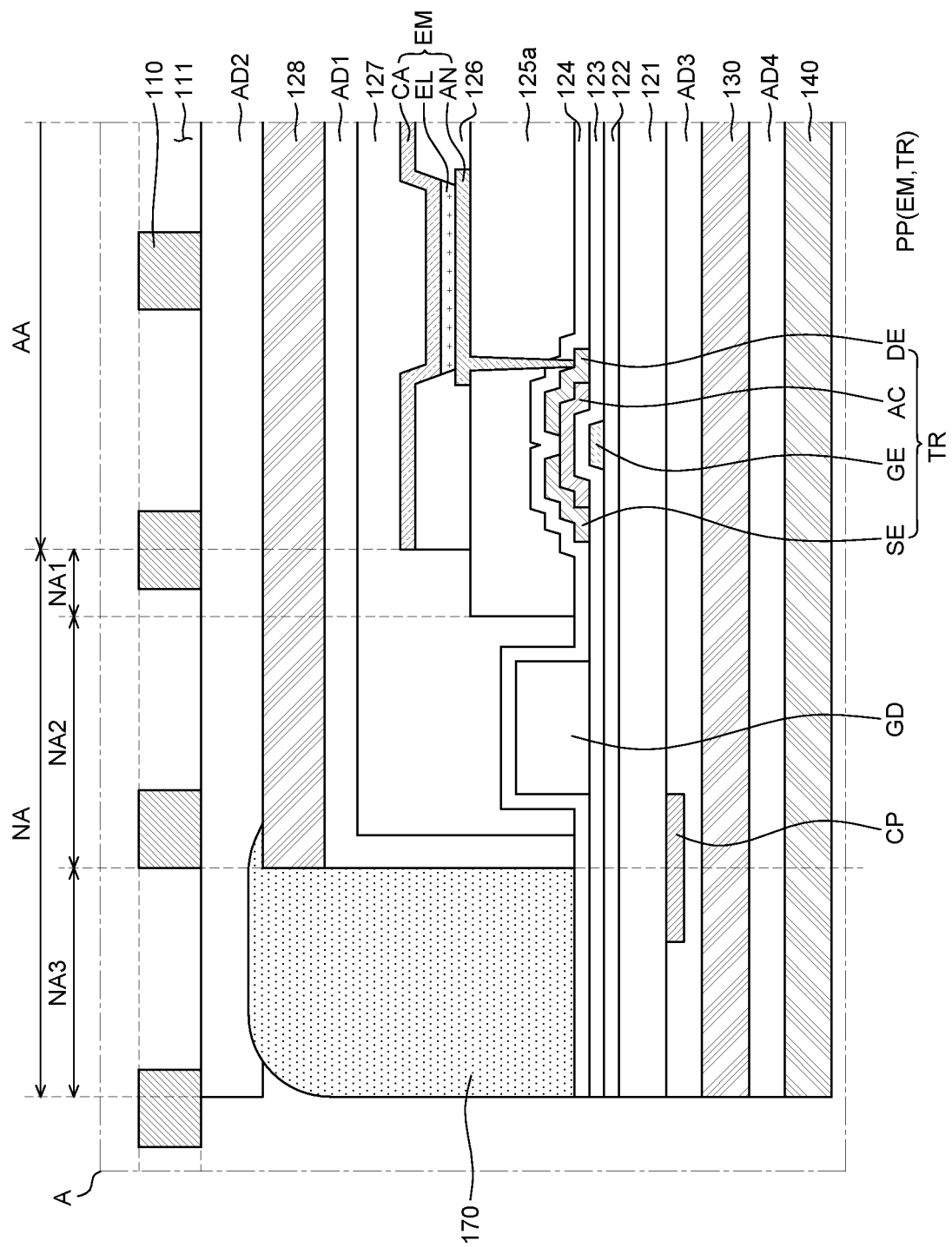
FIG. 6A is an enlarged cross-sectional view of an area A of FIG. 5A according to an exemplary embodiment of the present disclosure.
Figure 6B:
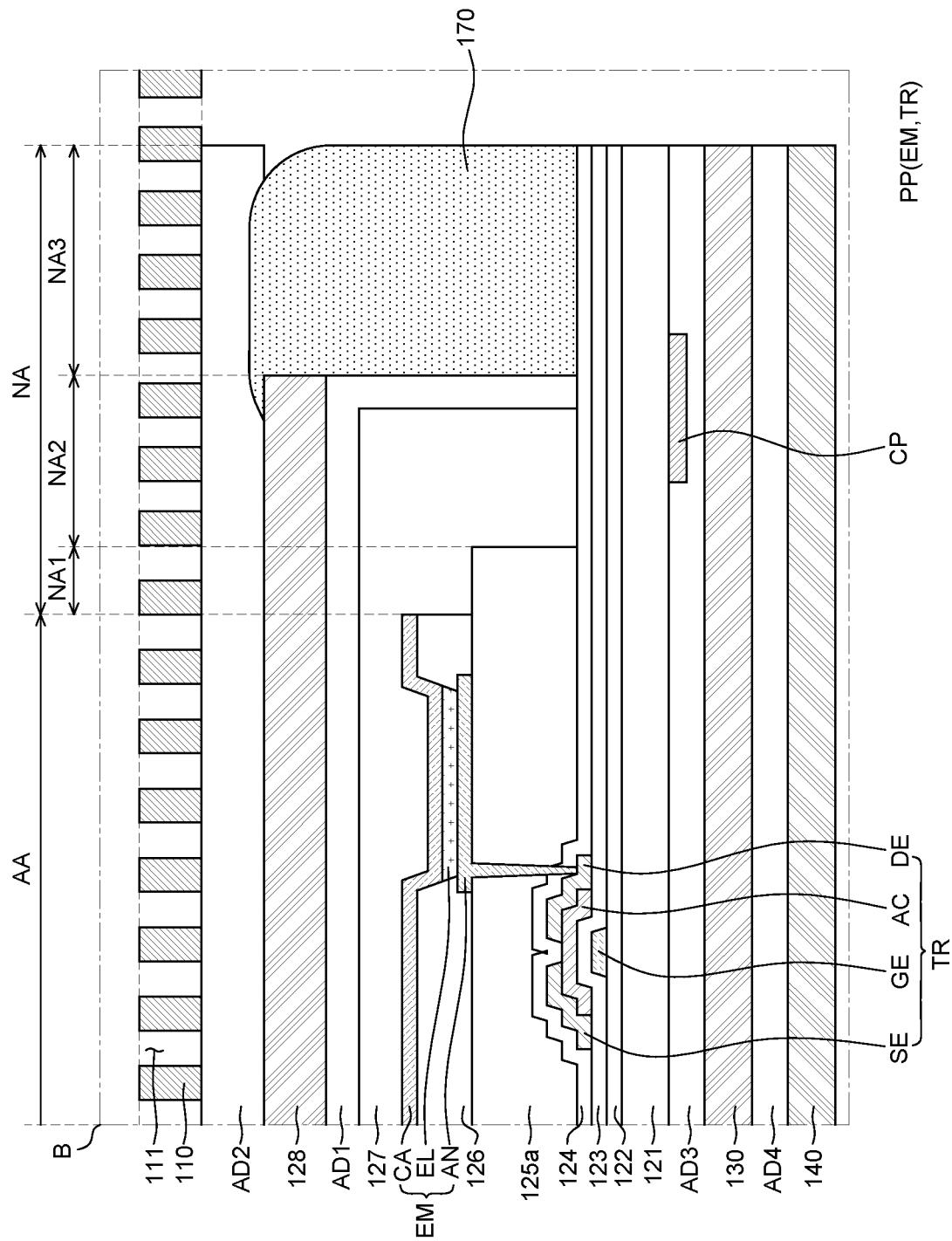
FIG. 6B is an enlarged cross-sectional view of an area B of FIG. 5B according to an exemplary embodiment of the present disclosure.

FIG. 6A is an enlarged cross-sectional view of an area A of FIG. 5A. FIG. 6B is an enlarged cross-sectional view of an area B of FIG. 5B. FIG. 6C is an enlarged cross-sectional view of an area C of FIG. 5B. Referring to FIGS. 6A to 6C, the display panel 120 includes a substrate 121, a buffer layer 122, a gate insulating layer 123, a passivation layer 124, a first planarization layer 125a, a second planarization layer 125b, a bank 126, an encapsulation layer 127, an encapsulation substrate 128, a gate driver GD, a link line LL, a pad PE, and a pixel unit PP. The pixel unit PP includes a plurality of semiconductor elements TR and a plurality of organic light emitting diodes EM.

First, referring to FIG. 6A, the display panel 120 includes a display area AA (e.g., an active area) and a non-display area NA (e.g., a non-display area). The non-display unit NA includes a first non-display area NA1, a second non-display area NA2, and a third non-display area NA3.

The first non-display NA1 extends from the display area A/A. In the first non-display area NA1, the first planarization layer 125A may be disposed to extend from the display area AA.

The second non-display NA2 extends from the first non-display area NA1. The second non-display area NA2 may be an area where the first planarization layer 125a is not disposed and the gate driver GD for driving the organic light emitting diode EM of the display area AA is disposed.

The third non-display area NA3 may be an area extending from the second non-display area NA2 and may be an outermost edge of the display panel 120. In the third non-display area NA3, the first polarization layer 125a is not disposed and the seal member 170 is disposed. Further, referring to FIG. 6C, in the third non-display area NA3, a plurality of pads PE which may be supplied with a signal from the printed circuit board 160 and the plurality of flexible films 150 may be disposed.

Referring to FIG. 6A, the buffer layer 122 is disposed in the entire display area AA and non-display area NA of the substrate 121.

The plurality of semiconductor elements TR is disposed in the display area AA on the buffer layer 122. The plurality of semiconductor elements TR may be disposed in each of the plurality of sub pixels of the display area AA. The plurality of semiconductor elements TR disposed in each of the plurality of sub pixels may be used as driving elements of the display device 100. The semiconductor element TR may be a thin film transistor (TFT), an N-channel metal oxide semiconductor (NMOS), a P-channel metal oxide semiconductor (PMOS), a complementary metal oxide semiconductor (CMOS), a field effect transistor (FET), or the like, but is not limited thereto. In the following description, it is assumed that the plurality of semiconductor elements 120 is thin film transistors, but is not limited thereto.

The semiconductor element TR includes a gate electrode GE, an active layer AC, a source electrode SE, and a drain electrode DE.

The gate electrode GE of the semiconductor element TR is disposed on the buffer layer 122. The gate electrode GE may be formed of a conductive material such as copper (Cu), aluminum (Al), molybdenum (Mo), titanium (Ti), or an alloy thereof, but it not limited thereto.

The gate insulating layer 123 is disposed on the gate electrode GE. In this case, the gate insulating layer 123 is disposed in the entire display area AA and non-display area NA. The gate insulating layer 123 is a layer for insulating the gate electrode GE from the active layer AC. The gate insulating layer 123 may be formed of an inorganic material, for example, may be configured by a single layer or a double layer of silicon oxide SiOx and silicon nitride SiNx, but is not limited thereto.

The active layer AC is disposed on the gate insulating layer 123. For example, the active layer AC may be formed of an oxide semiconductor, amorphous silicon, polysilicon, or the like, but is not limited thereto.

The source electrode SE and the drain electrode DE are disposed on the active layer AC to be spaced apart from each other. The source electrode SE and the drain electrode DE may be electrically connected to the active layer AC. The source electrode SE and the drain electrode DE may be formed of a conductive material such as copper (Cu), aluminum (Al), molybdenum (Mo), titanium (Ti), or an alloy thereof, but are not limited thereto.

The passivation layer 124 is disposed on the semiconductor element TR. The passivation layer 124 may be formed in the entire display area AA and non-display area NA. The passivation layer 124 is an insulating layer for protecting components below the passivation layer 124. The passivation layer 124 may be formed of an inorganic material, for example, may be configured by a single layer or a double layer of silicon oxide SiOx and silicon nitride SiNx, but is not limited thereto. Further, the passivation layer 124 may be omitted depending on the design.

The first planarization layer 125a is disposed on the passivation layer 124. The first planarization layer 125a may planarize the upper portion of the substrate 121 including the semiconductor element TR. The first planarization layer 125a is disposed in the entire display area AA and a portion of the non-display area NA. Specifically, the first planarization layer 125a may planarize the display area AA and an upper portion of the first non-display area NA1 extending from the display area AA. Specifically, the first planarization layer 125a may be disposed in the display area AA and the first non-display area NA1, but may not be disposed in the second non-display area NA2 and the third non-display area NA3. The first planarization layer 125a may be formed of an organic material, and for example, may be formed by a single layer or a double layer of an acrylic-based organic material, but is not limited thereto.

The first planarization layer 125a may be disposed only in the first non-display area NA1 extending from the display area AA, of the non-display area NA and the encapsulation layer 127 and the first adhesive layer AD1 may enclose the side surface and the upper surface of the first planarization layer 125a. Specifically, the first planarization layer 125a is formed of an organic material to be vulnerable to moisture. If the first planarization layer 125a is formed in the entire display area AA and non-display area NA, similarly to the buffer layer 122, the gate insulating layer 123, and the passivation layer 124, so that the side surface of the first planarization layer 125a is not enclosed by the encapsulation layer 127 and the first adhesive layer AD1, the moisture penetrating through the side surface of the first planarization layer 125a is transmitted to the display area AA, which may result in degradation of the organic light emitting diode EM. Therefore, the first planarization layer 125a is disposed only in the first non-display area NA1 and the encapsulation layer 127 and the encapsulation substrate 128 are disposed in the second non-display area NA2 so as to enclose the first planarization layer 125a. By doing this, the moisture penetration by the first planarization layer 125a may be reduced and the reliability of the display device 100 may be improved.

The organic light emitting diode EM is disposed on the first planarization layer 125a. The organic light emitting diode EM is a self-emitting element which emits light and is disposed in each of the plurality of sub pixels to be driven by the plurality of semiconductor elements TR. The organic light emitting diode EM may include an anode AN, an organic light emitting layer EL, and a cathode CA.

The anode AN may supply holes to the organic light emitting layer EL and may be formed of a conductive material having a high work function. For example, the anode AN may be formed of tin oxide (TO), indium tin oxide (ITO), indium zinc oxide (IZO), indium zinc tin oxide (ITZO), or the like, but is not limited thereto.

The bank 126 is disposed on the anode AN. The bank 126 is disposed to overlap the display area AA and cover the edge of the anode AN. The bank 126 is disposed at the boundary between the sub pixels which are adjacent to each other to reduce the mixture of light emitted from the organic light emitting diode EM of each of the plurality of sub pixels. The bank 126 may be formed of an insulating material. For example, the bank 126 may be formed of polyimide, acryl, or benzocyclobutene-based (BCB) resin, but it is not limited thereto.

The organic light emitting layer EL is disposed on the anode AN exposed through the bank 126. The organic light emitting layer EL is supplied with the holes from the anode AN and supplied with electrons from the cathode CA to emit light. The organic light emitting layer EL may be formed of a red organic light emitting layer, a green organic light emitting layer, a blue organic light emitting layer, and a white organic light emitting layer depending on a color of light emitted from the organic light emitting layer EL. In this case, when the organic light emitting layer EL is a white organic light emitting layer, color filters having various colors may be additionally disposed.

The cathode CA is disposed on the organic light emitting layer EL and the bank 126. The cathode CA may be disposed at least on the entire surface of the display area AA. The cathode CA may supply electrons to the organic light emitting layer EL and may be formed of a conductive material having a low work function. For example, the cathode CA may be formed of any one or more selected from a group consisting of metals such as magnesium (Mg), silver (Ag), and aluminum (Al), and an alloy thereof, but is not limited thereto. Further, since the display device 100 is a bottom emission type, the cathode CA may reflect the light emitted from the organic light emitting layer EL toward the substrate 121.

Referring to FIG. 6A, the gate driver GD is disposed on the gate insulating layer 123 in the second non-display area NA2. The gate driver GD may be disposed in the second non-display area NA2 which is adjacent to a left edge and a right edge of the display panel 120.

The gate driver GD outputs a gate voltage and an emission control voltage under the control of the timing controller 181 to select a sub pixel in which a data voltage is charged through a wiring line such as a gate line or an emission control signal line and adjust an emission timing. The gate driver GD shifts a gate voltage and an emission control voltage using a shift register to sequentially supply the gate voltage and the emission control voltage. The gate driver GD may be directly formed on the substrate 121 as illustrated in FIG. 6A by a gate-driver in panel (GIP) manner, but is not limited thereto. In this case, the second non-display area NA2 in which the gate driver GD is disposed may also be referred to as a GIP area.

In the meantime, even though in FIG. 6A, it is illustrated that the first planarization layer 125a does not cover the gate driver GD, the first planarization layer 125a may be disposed to cover a portion of the gate driver GD or the entire gate driver GD, but is not limited thereto.

The encapsulation layer 127 may be disposed in the entire display area AA and first non-display area NA1 and a portion of the second non-display area NA2 to cover the gate driver GD and the plurality of organic light emitting diodes EM. Specifically, the encapsulation layer 127 may be disposed so as to enclose the side surface of the first planarization layer 125a to reduce the moisture penetration through the first planarization layer 125a. The encapsulation layer 127 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy-based or acrylic-based polymer, but they are not limited thereto.

The encapsulation substrate 128 is disposed on the encapsulation layer 127. The encapsulation substrate 128 may be disposed in the entire display area AA, first non-display area NA1, and second non-display area NA2.

The first adhesive layer AD1 disposed between the first encapsulation layer 127 and the encapsulation substrate 128 is disposed in the entire display area AA, first non-display area NA1, and second non-display area NA2. The first adhesive layer AD1 may be disposed so as to enclose the side surface and the upper surface of the encapsulation layer 127 and the upper surface of the first adhesive layer AD1 may be disposed to be in contact with the entire rear surface of the encapsulation substrate 128. The first adhesive layer AD1 may be disposed so as to enclose also the side surfaces of the first planarization layer 125a and the encapsulation layer 127 to reduce the moisture penetration into the display area AA.

The seal member 170 is disposed on the third non-display area NA3. The seal member 170 may be disposed to be in contact with the upper surface of the passivation layer 124 disposed in the third non-display area NA3, the side surface of the first adhesive layer AD1, the side surface of the encapsulation substrate 128, and the second adhesive layer AD2. In this case, the seal member 170 may be disposed to cover the edge on the upper surface of the encapsulation substrate 128.

Figure 6C:
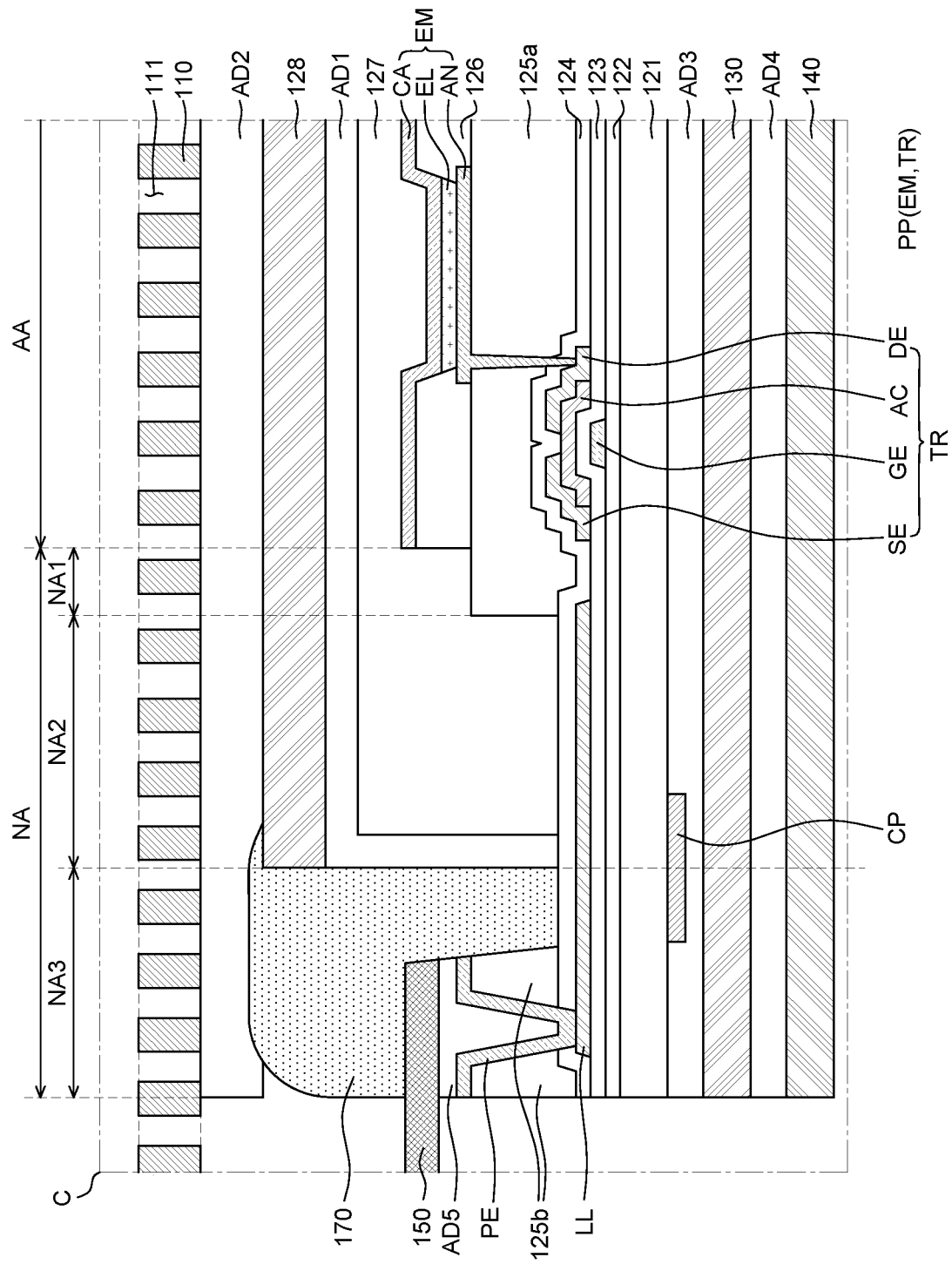
FIG. 6C is an enlarged cross-sectional view of an area C of FIG. 5B according to an exemplary embodiment of the present disclosure.

Referring to FIG. 6C, the plurality of pads PE is disposed in the third non-display area NA3. The plurality of pads PE are electrodes which electrically connect the plurality of flexible films 150 to the display panel 120. Signals from the printed circuit board 160 and the plurality of flexible films 150 may be transmitted to the plurality of sub pixels of the display area AA through the plurality of pads PE. The third non-display area NA3 in which the plurality of pads PE is disposed may also be referred to as a pad (PE) area. In this case, the plurality of pads PE may be formed of the same material by the same process as the anode AN of the plurality of organic light emitting diodes EM, but is not limited thereto.

First, the link line LL is disposed on the gate insulating layer 123. The link line LL is disposed on the gate insulating layer 123 in the third non-display area NA3 which is an outermost area of the display panel 120. The link line LL is electrically connected to the plurality of pads PE to transmit signal from the plurality of pads PE to the plurality of sub pixels of the display area AA. That is, the link line LL extends from the pad PE of the third non-display area NA3 at the outermost edge of the display panel 120 to the display area AA to electrically connect the plurality of pads PE to the plurality of sub pixels. In this case, the link line LL may be formed of the same material by the same process as the source electrode SE and the drain electrode DE of the plurality of semiconductor elements TR, but is not limited thereto.

In the meantime, for the convenience of description, even though in FIG. 6C, it is illustrated that the link line LL is disposed also in the first non-display area NA1, the link line LL may be disposed to extend to the display area AA, but is not limited thereto.

Further, the passivation layer 124 is disposed on the plurality of link lines LL and the second planarization layer 125b is disposed on the passivation layer 124. In this case, the edge of the encapsulation substrate 128 may be disposed between the first planarization layer 125a and the second planarization layer 125b. The second planarization layer 125b may be formed of the same material by the same process as the first planarization layer 125a. The second planarization layer 125b is disposed only in the area adjacent to the plurality of pads PE in the third non-display area NA3 and the second planarization layer 125b is spaced apart from the first planarization layer 125a. Since the second planarization layer 125b is spaced apart from the first planarization layer 125a, even though the moisture penetrates the second planarization layer 125b, the moisture does not affect the first planarization layer 125a. Therefore, the degradation of the reliability of the display device 100 may be reduced.

In the meantime, even though in FIG. 6C, it is illustrated that the second planarization layer 125b is disposed on the plurality of link lines LL, the second planarization layer 125b may be omitted depending on the design of the display device 100, and it is not limited thereto.

The plurality of pads PE is disposed on the second planarization layer 125b and the passivation layer 124. The plurality of pads PE is disposed on the second planarization layer 125b and the passivation layer 124 to fill the contact hole which exposes the plurality of link lines LL to be in contact with the plurality of link lines LL. Therefore, the plurality of pads PE may be electrically connected to the plurality of link lines LL.

The plurality of flexible films 150 is disposed on the plurality of pads PE. One ends of the plurality of flexible films 150 may be electrically connected to the plurality of pads PE. In this case, the plurality of flexible films 150 and the plurality of pads PE may be electrically connected to each other through a fifth adhesive layer AD5. The fifth adhesive layer AD5 may be a conductive adhesive layer including conductive particles and for example, the fifth adhesive layer AD5 may be an anisotropic conductive film (ACF), but is not limited thereto.

Referring to FIGS. 6A to 6C again, the support member CP is disposed between the substrate 121 and the third adhesive layer AD3. The support member CP may be disposed to overlap the edge of the encapsulation substrate 128. That is, the support member CP may be disposed to overlap the boundary of the second non-display area NA2 and the third non-display area NA3. Therefore, the support member CP is disposed in a portion of the second non-display area NA2 and a portion of the third non-display area NA3 and overlaps an area where the first planarization layer 125a is not disposed.

The support member CP may be formed of the same type of material as the seal member 170, but the Young's modulus value of the support member CP may be greater than that of the seal member 170. For example, the support member CP may be formed of an acrylic, urethane, and silicon based curable material having a Young's modulus value of 1 GPa to 1.5 GPa, but is not limited thereto.

The support member CP may reduce the crack of the display panel 120 at the edge of the encapsulation substrate 128. Specifically, the encapsulation substrate 128 is disposed to the second non-display area NA2, but is not disposed in the third non-display area NA3. Further, when the display unit DP is wound, in the second non-display area NA2 in which the encapsulation substrate 128 formed of a material having rigidity is disposed, a stress applied when the display unit DP is wound is relatively strong. In contrast, in the third non-display area NA3 in which the encapsulation substrate 128 is not disposed, a stress applied when the display unit DP is wound is relatively weak. Therefore, the stress applied to the display panel 120 may be sharply changed in the vicinity of the edge of the encapsulation substrate 128 and the boundary of the second non-display area NA2 and the third non-display area NA3.

In the meantime, in the second non-display area NA2 and the third non-display area NA3 adjacent to the edge of the encapsulation substrate 128, the first planarization layer 125a is not disposed, but only the buffer layer 122, the gate insulating layer 123, and the passivation layer 124 are disposed. The planarization layer 125a formed of an organic material has a low hardness and a high malleability to absorb and relieve the stress. However, the buffer layer 122, the gate insulating layer 123, the passivation layer 124, the link line LL, the substrate 121, and the like, which are formed of a material having a high hardness and a low malleability may be relatively easily cracked by the stress and specifically, are highly likely to be cracked by the stress sharply changed at the edge of the encapsulation substrate 128.

Therefore, at the boundary between the second non-display area NA2 and the third non-display area NA2 which is an area adjacent to the edge of the encapsulation substrate 128 where the stress is sharply changed, the first planarization layer 125a which absorbs a tensile stress and a compressive stress to reduce the crack is not disposed, but only the buffer layer 122, the gate insulating layer 123, the passivation layer 124, the link line LL, and the substrate 121 which are formed of a material having a high hardness and a low malleability to be easily cracked are disposed so that the possibility of the crack is high.

Further, when the buffer layer 122, the gate insulating layer 123, the passivation layer 124, the link line LL, or the substrate 121 is cracked by winding or unwinding the display panel 120, the crack propagates to components adjacent to the buffer layer 122, the gate insulating layer 123, the passivation layer 124, the link line LL, and the substrate 121. Therefore, the wiring lines may be damaged and the reliability of the display device 100 may be lowered.

Therefore, at the boundary of the second non-display area NA2 and the third non-display area NA3 in which the first planarization layer 125a which absorbs or relieves the stress is not disposed and the stress is sharply changed depending on whether the encapsulation substrate 128 is disposed, the support member CP which overlaps the edge of the encapsulation substrate 128 may be disposed to reduce the crack of the buffer layer 122, the gate insulating layer 123, the passivation layer 124, the link line LL, and the substrate 121 which are formed of a material having a high rigidity and a low malleability.

The support member CP is disposed below the substrate 121 to lower the neutral plane to the lower portion of the substrate 121 at the boundary of the second non-display area NA2 and the third non-display area NA3 which is the edge of the encapsulation substrate 128 or dispose the neutral plane to be adjacent to the substrate 121, the buffer layer 122, the gate insulating layer 123, the passivation layer 124, and the link line LL. As the neutral plane is lowered by the support member CP, the buffer layer 122, the gate insulating layer 123, the passivation layer 124, the link line LL, and the substrate 121 may be disposed on the neutral plane or an upper area of the neutral plane. Further, the stress which is applied to the buffer layer 122, the gate insulating layer 123, the passivation layer 124, the link line LL, and the substrate 121 is reduced or even though the stress is applied, a compressive stress may be applied rather than the tensile stress.

The neutral plane is an area where the compressive stress or the tensile stress is cancelled with each other so that the stress is not applied when the display unit DP is wound. With respect to the neutral plane, the compressive stress is applied to components disposed one area of the neutral plane and the tensile stress is applied to components disposed in the other area of the neutral plane. Specifically, the compressive stress which compresses a length to be shorter than the original length when the display unit DP is wound may act on one area of the neutral plane to which the compressive stress is applied. The tensile stress which stretches a length to be longer than the original length when the display unit DP is wound may act on the other area of the neutral plane to which the tensile stress is applied. Specifically, the component disposed in the area on which the tensile stress acts may be more vulnerable to the external force, than the configuration disposed in the area on which the compressive stress acts. Therefore, the components of the display unit DP which is vulnerable to the external force, that is, the stress generated when the display unit DP is wound is disposed on the neutral plane or an area which is adjacent to the neutral plane and is applied with the compressive stress to reduce the crack of the display unit DP.

As described above with reference to FIG. 3, when the display device 100 according to the exemplary embodiment of the present disclosure is wound, the back cover 110 of the display unit DP may be disposed to be relatively closer to the surface of the roller 181, than the polarizer of the display unit DP. Therefore, the compressive stress may act from the back cover 110 to the neutral plane and the tensile stress may act from the neutral plane to the polarizer 140.

In this case, as described above, the support member CP is formed of a material having a high modulus value to lower the neutral plane. The support member CP lowers the neutral plane at the boundary of the second non-display area NA2 and the third non-display area NA3 which is the edge of the encapsulation substrate 128 where the stress is sharply changed so that the buffer layer 122, the gate insulating layer 123, the passivation layer 124, the link line LL, the substrate 121, and the like, which have a high rigidity and a low malleability to be easily cracked by the sharply changed stress are disposed to be adjacent to the neutral plane or disposed above the neutral. Therefore, the compressive stress may be applied thereto.

The support member CP is disposed in the second non-display area NA2 and the third non-display area NA3, but may not be disposed in the display area AA. As described above, the display device 100 according to the exemplary embodiment of the present disclosure is a bottom emission type so that light emitted from the organic light emitting diode EM is discharged below the substrate 121. Therefore, when the support member CP disposed below the substrate 121 is disposed to the display area AA, the emission of light emitted from the organic light emitting diode EM may be interfered so that the support member CP may be disposed only in the non-display area NA.

In the display device 100 according to the exemplary embodiment of the present disclosure, the support member CP is disposed so as to overlap the edge of the encapsulation substrate 128. Therefore, when the display unit DP is wound, the damage of the display panel 120 by the stress which is sharply changed at the edge of the encapsulation substrate 128 may be reduced. First, when the display unit DP is wound, the stress applied to the display panel 120 may be sharply changed in an area which is adjacent to the edge of the encapsulation substrate 128 and the boundary of the second non-display area NA2 and the third non-display area NA3. Specifically, since the encapsulation substrate 128 is formed of a material having a rigidity, when the display unit DP is wound, the stress is relatively strong in the second non-display area NA2 in which the encapsulation substrate 128 is disposed and the stress is relatively weak in the third non-display area NA3 where the encapsulation substrate 128 is not disposed. Therefore, the stress may be sharply changed at the boundary of the second non-display area NA2 and the third non-display area NA3. Further, the buffer layer 122, the gate insulating layer 123, the passivation layer 124, the link line LL, and the substrate 121 which overlap the boundary of the third non-display area NA3 and the second non-display area NA2 and are formed of a material having a high rigidity and a low malleability may be easily cracked by the stress which is sharply changed. At the boundary of the second non-display area NA2 and the third non-display area NA3 which is an edge of the encapsulation substrate 128 where the stress is sharply changed, the first planarization layer 125a which is formed of an organic material and has a high malleability to absorb and relieve the sharply changed stress is not disposed. The first planarization layer 125a formed of an organic material is vulnerable to the moisture so that the encapsulation layer 127 and the first adhesive layer AD1 may enclose the first planarization layer 125a so as not to be exposed to the outside. In order to enclose the first planarization layer 125a by the encapsulation layer 127 and the first adhesive layer AD1, the first planarization layer 125a may be disposed only in the display area AA and the first non-display area NA1, but may not be disposed in the second non-display area NA2 and the third non-display area NA3. In summary, in a circumstance where the first planarization layer 125a which absorbs and relieves the stress is not disposed at the boundary of the third non-display area NA3 and the second non-display area NA2 which is an edge of the encapsulation substrate 128, when the display unit DP is wound, the stress which is sharply changed at the boundary of the second non-display area NA2 and the third non-display area NA3 may be concentrated onto the buffer layer 122, the gate insulating layer 123, the passivation layer 124, the link line LL, the substrate 121, and the like, which are formed of a material having a high hardness and a low malleability. Therefore, the buffer layer 122, the gate insulating layer 123, the passivation layer 124, the link line LL, the substrate 121, and the like, may be cracked. Therefore, in the display device 100 according to the present disclosure, the support member CP is disposed below the substrate 121 so as to overlap the third non-display area NA3 and the second non-display area NA2 respectively which is an edge of the encapsulation substrate 128, thereby lowering the neutral plane. The support member CP may be disposed on the rear surface of the substrate 121 to lower the neutral plane toward the rear surface of the substrate 121. When the neutral plane is lowered, the neutral plane may be disposed below the substrate 121, the buffer layer 122, the gate insulating layer 123, the passivation layer 124, the link line LL, and the like, which are formed of a material having a high hardness and a low malleability. Further, when the display unit DP is wound, the substrate 121, the buffer layer 122, the gate insulating layer 123, the passivation layer 124, and the link line LL may be disposed in an area where no stress acts or a compressive stress acts, rather than the tensile stress. Therefore, since no stress acts or a compressive stress acts on the substrate 121, the buffer layer 122, the gate insulating layer 123, the passivation layer 124, and the link line LL, as compared with the case that the tensile stress acts, the generation of the crack may be reduced. Therefore, in the display device 100 according to an exemplary embodiment of the present disclosure, the support member CP is disposed on the rear surface of the substrate 121 to overlap the edge of the encapsulation substrate 128 in which the stress is sharply changed to optimize the neutral plane. Further, the stress does not act or the compressive stress may act on the substrate 121, the buffer layer 122, the gate insulating layer 123, the passivation layer 124, the link line LL, and the like, which are vulnerable to the crack, rather than the tensile stress. Therefore, the support member CP is disposed in an area which overlaps the edge of the encapsulation substrate 128 and the first planarization layer 125a is not disposed to optimize the neutral plane such that the compressive stress acts on components which are vulnerable to the crack, instead of the tensile stress. Accordingly, the reliability of the display device 100 may be improved.

Figure 7:
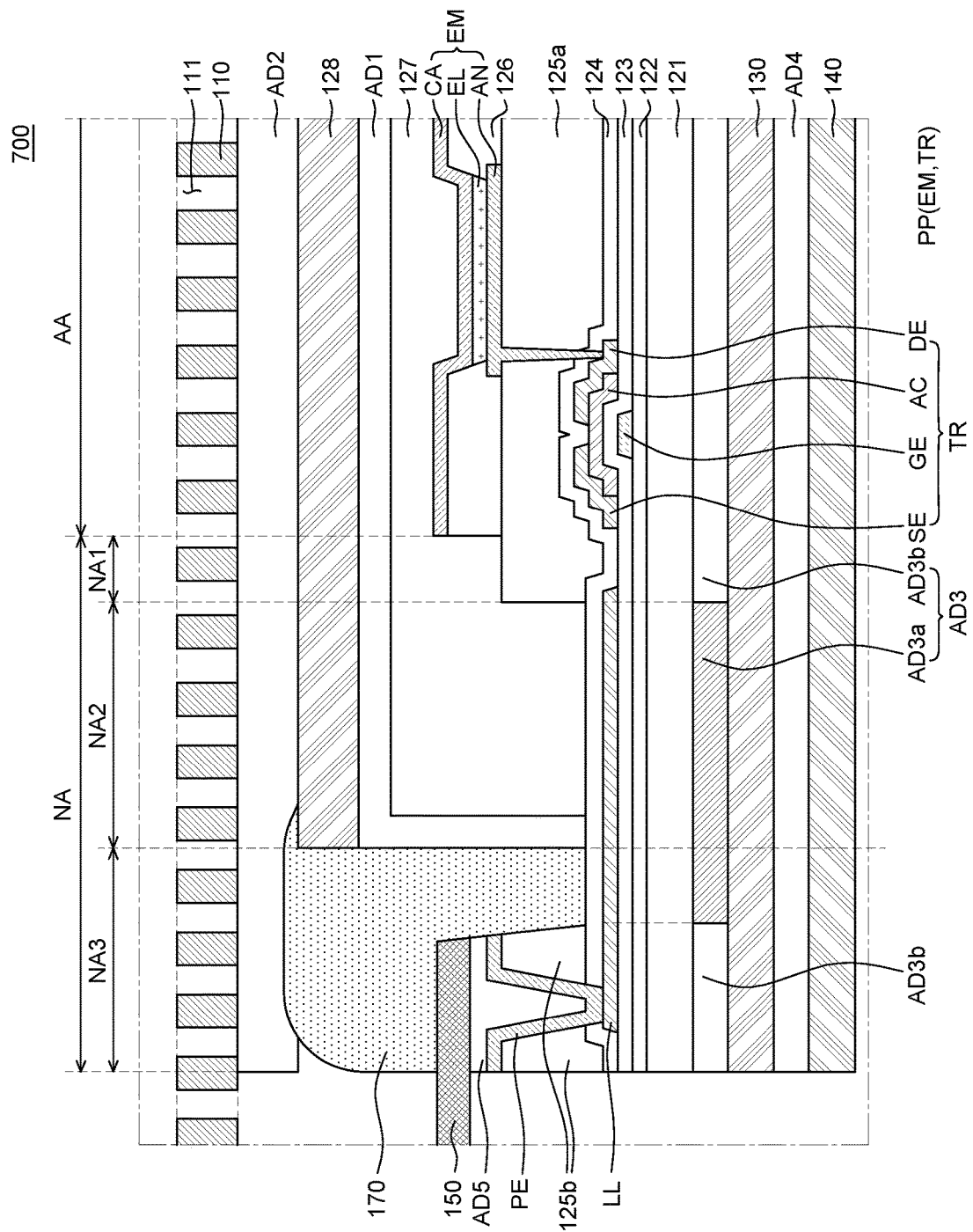
FIGS. 7 to 10 are enlarged cross-sectional views of a display device according to various exemplary embodiments of the present disclosure.
Figure 8:
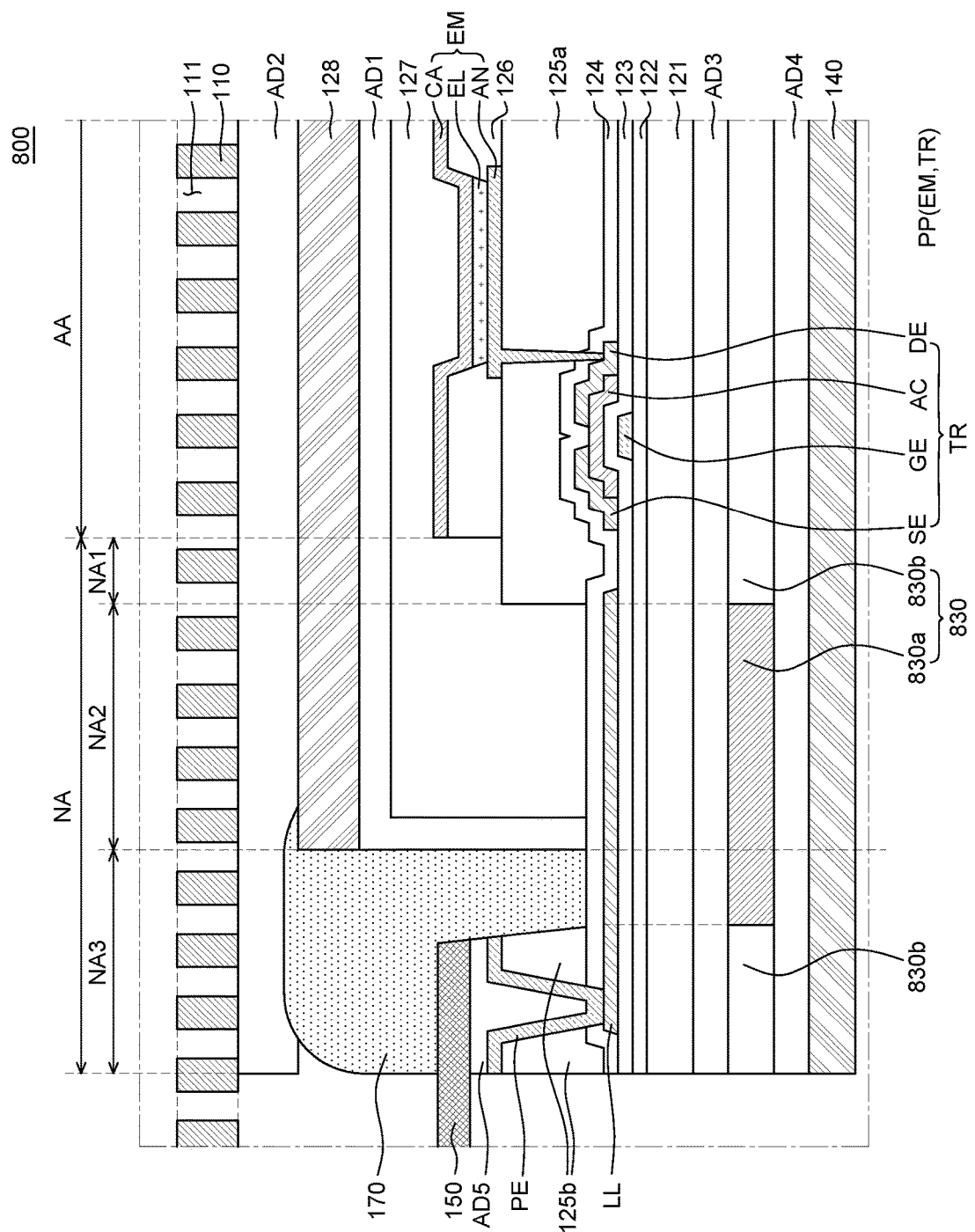
Figure 9:
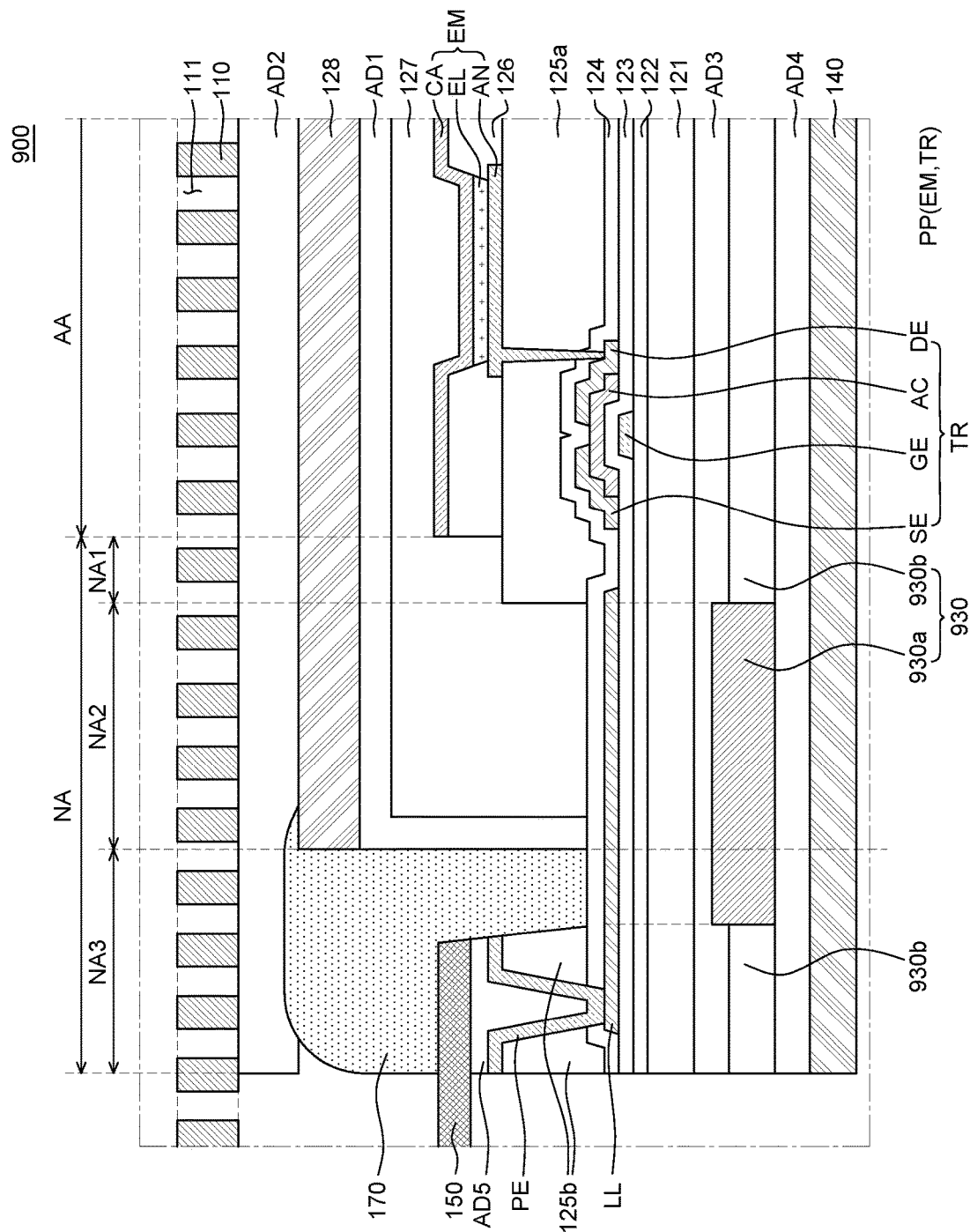
Figure 10:
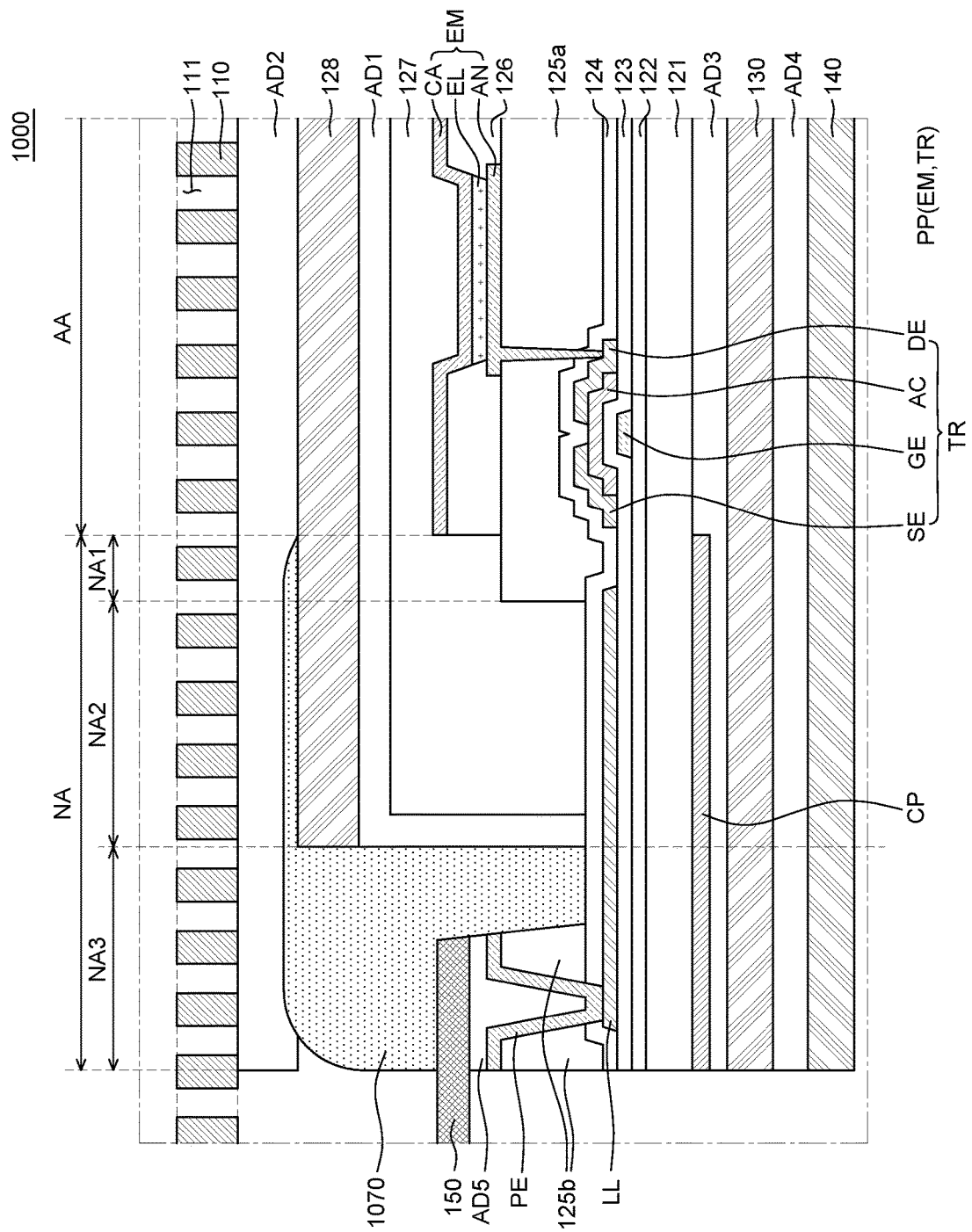

FIGS. 7 to 10 are enlarged cross-sectional views of a display device according to various exemplary embodiments of the present disclosure. FIG. 7 is an enlarged cross-sectional view of an area C of a display device according to another exemplary embodiment of the present disclosure. FIG. 8 is an enlarged cross-sectional view of an area C of a display device according to still another exemplary embodiment of the present disclosure. FIG. 9 is an enlarged cross-sectional view of an area C of a display device according to still another exemplary embodiment of the present disclosure. FIG. 10 is an enlarged cross-sectional view of an area C of a display device according to still another exemplary embodiment of the present disclosure. Only difference between display devices 700, 800, 900, and 1000 of FIGS. 7 to 10 and the display device 100 of FIGS. 1 to 6C is a support member CP, but other configuration is substantially the same, so that a redundant description will be omitted. For the convenience of description, even though in FIGS. 7 to 10, only the enlarged cross-sectional view of an area C of the display devices 700, 800, 900, and 1000 is illustrated, the arrangement of the support member CP in the area A and the area B of the display devices 700, 800, 900, and 1000 may be the same.

Referring to FIG. 7, the third adhesive layer AD3 is formed of a first portion AD3a and a second portion AD3b. The first portion AD3a overlaps at least a portion of the non-display area NA and the remaining portion of the non-display area NA excluding the first portion AD3a is the second portion AD3b. The first portion AD3a and the second portion AD3b may be integrally formed or separately formed. In this case, the first portion AD3a and the second portion AD3b may be formed of a material having adhesiveness but the first portion AD3a and the second portion AD3b may have different modulus values. For example, the third adhesive layer AD3 may be acrylic or silicon based polymer adhesive and the first portion AD3a may be formed of an acrylic or silicon based polymer adhesive, a photo curable adhesive, or a thermosetting adhesive. The modulus value of the first portion AD3a may be approximately several hundreds of MPa or higher. The second portion AD3b may be formed of acrylic or silicon based polymer adhesive and a modulus value thereof may be several to several tens of MPa.

The first portion AD3a may be disposed to overlap the entire second non-display area NA2 of the non-display area NA and a portion of the third non-display area NA3. The first portion AD3a disposed in the second non-display area NA2 and the third non-display area NA3 may be disposed so as to overlap the edge of the encapsulation substrate 128. The first portion AD3a may be disposed so as to overlap an area where the first planarization layer 125a and the second planarization layer 125b are not disposed. As shown in FIG. 7, a first end of the first portion AD3a extends to an edge of the first planarization layer 125a without overlapping the edge of the first planarization layer 125a. Furthermore, a second end of the first portion AD3a that is opposite the first end extends to an edge of the second planarization layer 125b without overlapping the edge of the second planarization layer 125b.

When the display unit DP is wound, the stress which is applied to the display unit DP may be sharply changed with respect to the edge of the encapsulation substrate 128. In this case, the first planarization layer 125a or the second planarization layer 125b having a high malleability which may absorb or relieve the stress is not disposed in the vicinity of the edge of the encapsulation substrate 128. Therefore, the substrate 121, the buffer layer 122, the gate insulating layer 123, the passivation layer 124, the link line LL, and the like, which have a high hardness and a low malleability are highly likely to be cracked in the vicinity of the edge of the encapsulation substrate 128.

In this case, as described above, the first portion AD3a has a modulus value which is higher than that of the second portion AD3b and is disposed to overlap the edge of the encapsulation substrate 128 which is an area where the first planarization layer 125a and the second planarization layer 125b are not disposed, below the substrate 121. Therefore, the neutral plane may be lowered from the edge of the encapsulation substrate 128. Therefore, the substrate 121, the buffer layer 122, the gate insulating layer 123, the passivation layer 124, the link line LL, and the like, which are easily cracked by the stress which is sharply changed at the edge of the encapsulation substrate 128 are disposed on the neutral plane or above the neutral plane. Therefore, even though the stress is applied, the compressive stress is applied so that the crack may be reduced. Therefore, the first portion AD3a having a high modulus value for lowering the neutral plane may serve as the third adhesive layer AD3 or the support member CP. Therefore, in the display device 700 according to another exemplary embodiment of the present disclosure, the first portion AD3a of the third adhesive layer AD3 disposed below the substrate 121 may serve as the support member CP. Further, the neutral plane is lowered at the edge of the encapsulation substrate 128 which is an area where the first planarization layer 125a and the second planarization layer 125b are not disposed so that the crack of some components which are vulnerable to the external force may be reduced.

Referring to FIG. 8, the barrier film 830 is formed of a first portion 830a and a second portion 830b. The first portion 830a overlaps at least a portion of the non-display area NA and the remaining portion of the non-display area NA excluding the first portion 830a is the second portion 830b. In this case, the first portion 830a and the second portion 830b may be integrally formed or separately formed. The first portion 830a and the second portion 830b may be formed of materials having different modulus values. For example, the second portion 830b may be formed of COP to have a modulus value of approximately 3 GPa. The first portion 830a may be formed of a plastic based film such as a polyethylene terephthalate (PET) or polyethylene naphthalate (PEN) and has a modulus value of approximately 10 GPa or higher.

The first portion 830a may be disposed to overlap the entire first non-display area NA1 and the entire second non-display area NA2 of the non-display area NA and a portion of the third non-display area NA3. Further, the first portion 830a disposed to overlap the first non-display area NA1, the second non-display area NA2 and the third non-display area NA3 may be disposed so as to overlap the edge of the encapsulation substrate 128. The first portion 830a may overlap the first planarization layer 125a disposed in the first non-display area NA1 and a portion of the non-display area NA where the first planarization layer 125a and the second planarization layer 125b are not disposed. As shown in FIG. 8, a first end of the first portion 830a extends to an edge of the first planarization layer 125a without overlapping the edge of the first planarization layer 125a. Furthermore, a second end of the first portion 830a that is opposite the first end extends to an edge of the second planarization layer 125b without overlapping the edge of the second planarization layer 125b.

In this case, as described above, the first portion 830a has a modulus value which is higher than that of the second portion 830b and is disposed to overlap the edge of the encapsulation substrate 128, below the substrate 121. Therefore, the neutral plane may be lowered from the edge of the encapsulation substrate 128. Therefore, since the substrate 121, the buffer layer 122, the gate insulating layer 123, the passivation layer 124, the link line LL, and the like, which are easily cracked by the stress which is sharply changed at the edge of the encapsulation substrate 128 are disposed on the neutral plane or above the neutral plane, even though the stress is applied, the compressive stress is applied so that the crack may be reduced. Therefore, the first portion 830a having a high modulus value for lowering the neutral plane may serve as the barrier film 830 or the support member CP. Therefore, in the display device 800 according to another exemplary embodiment of the present disclosure, the first portion 830a of the barrier film 830 disposed below the substrate 121 may serve as the support member CP. Further, the neutral plane is lowered at the edge of the encapsulation substrate 128 which is an area where the first planarization layer 125a and the second planarization layer 125b are not disposed so that the crack of some components which are vulnerable to the external force may be reduced.

Referring to FIG. 9, the barrier film 930 is formed of a first portion 930a and a second portion 930b. The first portion 930a overlaps at least a portion of the non-display area NA and the remaining portion excluding the first portion 930a is the second portion 930b. The first portion 930a and the second portion 930b may be integrally formed or separately formed. In this case, the first portion 930a and the second portion 930b may be formed of materials having different modulus values. For example, the second portion 930b may be formed of COP to have a modulus value of approximately 3 GPa. The first portion 930a may be formed of a plastic based film such as a polyethylene terephthalate (PET) or polyethylene naphthalate (PEN) and has a modulus value of approximately 10 GPa or higher.

Further, a thickness of the first portion 930a may be larger than a thickness of the second portion 930b. Therefore, a thickness of a portion of the third adhesive layer AD3 which bonds the second portion 930b of the barrier film 930 to the substrate 212 may be larger than a thickness of the remaining portion of the third adhesive layer AD3 which bonds the first portion 930a of the barrier film 130 to the substrate 121. Therefore, the first portion 930a may be formed of a material having a higher modulus value than that of the second portion 930b and have a larger thickness, so that the rigidity of the first portion 930a may be improved as compared with the second portion 930b.

The first portion 930a may be disposed to overlap the entire first non-display area NA1 and the entire second non-display area NA2 of the non-display area NA and a portion of the third non-display area NA3. The first portion 930a disposed to overlap the first non-display area NA1, the second non-display area NA2 and the third non-display area NA3 may be disposed so as to overlap the edge of the encapsulation substrate 128. The first portion 930a may overlap the first planarization layer 125a disposed in the first non-display area NA1 and a portion of the non-display area NA where the first planarization layer 125a and the second planarization layer 125b are not disposed.

In this case, the first portion 930a is formed of a material having a modulus value which is higher than that of the second portion 930b and have a larger thickness to have a high rigidity and is disposed to overlap the edge of the encapsulation substrate 128, below the substrate 121. Therefore, the neutral plane may be lowered from the edge of the encapsulation substrate 128. Therefore, the substrate 121, the buffer layer 122, the gate insulating layer 123, the passivation layer 124, the link line LL, and the like, which are easily cracked by the stress which is sharply changed at the edge of the encapsulation substrate 128 are disposed on the neutral plane or above the neutral plane. Therefore, even though the stress is applied, the compressive stress is applied so that the crack may be reduced. Therefore, the first portion 930a having a high modulus value and a large thickness for lowering the neutral plane may serve as the barrier film 930 or the support member CP. Therefore, in the display device 900 according to another exemplary embodiment of the present disclosure, the first portion 930a of the barrier film 930 disposed below the substrate 121 may serve as the support member CP. Further, the neutral plane is lowered at the edge of the encapsulation substrate 128 which is an area where the first planarization layer 125a and the second planarization layer 125b which absorb or relieve the sharply changed stress are not disposed so that the crack of some components which are vulnerable to the external force may be reduced.

Referring to FIG. 10, the seal member 1070 may be disposed to cover the upper surface of the passivation layer 124, the side surface of the encapsulation layer 127, and the encapsulation substrate 128. In this case, the seal member 1070 is disposed on the upper surface of the encapsulation substrate 128 to extend to the first non-display area NA1. That is, the seal member 1070 may cover the encapsulation substrate 128 to overlap the first non-display area NA1 and the second non-display area NA2 on the encapsulation substrate 128. Therefore, the seal member 1070 may be disposed so as to overlap the entire non-display area NA. Furthermore, the seal member 1070 overlaps the support member CP in its entirety as shown in FIG. 10 in one embodiment.

The support member CP is disposed below the substrate 121. The support member CP is disposed between the substrate 121 and the third adhesive layer AD3. The support member CP is disposed so as to overlap the entire non-display area NA. Therefore, the entire support member CP may be disposed so as to overlap the seal member 1070.

The support member CP may be formed of the same material as the seal member 1070, but the modulus value of the support member may be higher than that of the seal member. For example, the support member CP may be formed of an acrylic, urethane, and silicon based curable material having a modulus value of 1 GPa to 1.5 GPa, but is not limited thereto.

In the meantime, the seal member 1070 and the support member CP are disposed so as to cover the entire second non-display area NA2 which overlaps the edge of the encapsulation substrate 128 and does not have the first planarization layer 125a and the second planarization layer 125b and a portion of the third non-display area NA3. The seal member 170 and the support member CP may relieve the stress which is sharply changed at the edge of the encapsulation substrate 128 above or below the substrate 121, depending on whether the encapsulation substrate 128 is disposed. That is, the seal member 170 extends to fix the edge of the encapsulation substrate 128 above the encapsulation substrate 128 so that the stress sharply changed at the edge of the encapsulation substrate 128 may be relieved. Further, the support member CP is disposed below the encapsulation substrate 128 to overlap the edge of the encapsulation substrate 128, so that the neutral plane is lowered from the edge of the encapsulation substrate 128 to dispose the substrate 121 and the components adjacent to the substrate 121 on the neutral plane or in an area where the tensile stress acts. Therefore, in the display device 1000 according to still another exemplary embodiment of the present disclosure, the seal member 1070 is disposed above the substrate 121 so as to overlap the edge of the encapsulation substrate 128 and the support member CP is disposed below the substrate 121 to overlap the edge of the encapsulation substrate 128. Therefore, the stress which is sharply changed with respect to the edge of the encapsulation substrate 128 may be relieved. Further, the neutral plane moves below the substrate 121, the buffer layer 122, the gate insulating layer 123, the passivation layer 124, and the link line LL which are vulnerable to the external force to reduce the crack of the display panel 120 and the degradation of the reliability.

In the display devices 700, 800, 900, and 1000 according to various exemplary embodiments of the present disclosure, the neutral plane in the display panel 120 may be easily optimized using components in the display panel 120. When the display unit DP of the display device is wound, the stress which is applied to the display unit DP may be sharply changed with respect to the edge of the encapsulation substrate 128. For example, the stress applied to the second non-display area NA2 where the encapsulation substrate 128 is disposed may be significantly different from the stress applied to the third non-display area NA3 where the encapsulation substrate 128 is not disposed. Therefore, the stress may be sharply changed at the edge of the encapsulation substrate 128 depending on whether the encapsulation substrate 128 is provided. Further, since the first planarization layer 125a which is vulnerable to the moisture is not disposed in the second non-display area NA2 and the third non-display area NA3, it may be difficult to absorb or relieve the stress which is sharply changed at the boundary of the second non-display area NA2 and the third non-display area NA3. Therefore, it may result in the crack of the substrate 121, the buffer layer 122, the gate insulating layer 123, the passivation layer 124, the link line LL, and the like, which are formed of a material having a low malleability and a high hardness. Therefore, in the display devices 700, 800, 900, and 1000 according to various exemplary embodiments of the present disclosure, in order to reduce the crack of the components such as the substrate 121, the buffer layer 122, the gate insulating layer 123, the passivation layer 124, and the link line LL onto which the stress sharply changed at the edge of the encapsulation substrate 128 is concentrated to be easily cracked, the neutral plane may be lowered toward the rear surface of the substrate 121. For example, referring to FIG. 7, in the third adhesive layer AD3 on the rear surface of the substrate 121, a portion of the third adhesive layer AD3 which overlaps the edge of the encapsulation substrate 128 and the area where the first planarization layer 125a and the second planarization layer 125b are not disposed is configured as a first portion AD3a having a high modulus value. By doing this, the neutral plane may be lowered toward the lower side of the substrate 121 in the second non-display area NA2 and the third non-display area NA3.

Next, referring to FIG. 8, a portion of the barrier film 830 which overlaps the edge of the encapsulation substrate 128 and the area where the first planarization layer 125a and the second planarization layer 125b are not disposed is configured as a first portion 830a having a high modulus value. By doing this, the neutral plane may be lowered toward the lower side of the substrate 121 in the second non-display area NA2 and the third non-display area NA3. Next, referring to FIG. 9, a portion of the barrier film 930 which overlaps the edge of the encapsulation substrate 128 and the area where the first planarization layer 125a and the second planarization layer 125b are not disposed is configured as a first portion 930a having a high modulus value and a large thickness. By doing this, the neutral plane may be lowered toward the lower side of the substrate 121 in the second non-display area NA2 and the third non-display area NA3. Finally, referring to FIG. 10, the seal member 1070 on the encapsulation substrate 128 extends so as to overlap the edge of the encapsulation substrate 128 and the area where the first planarization layer 125a and the second planarization layer 125b are not disposed and the support member CP below the encapsulation substrate 128 may extend so as to overlap the seal member 1070. Therefore, the seal member 1070 is disposed above the encapsulation substrate 128 to cover the edge of the encapsulation substrate 128 to relieve the stress which is sharply changed at the edge of the encapsulation substrate 128. Further, the support member CP is disposed below the encapsulation substrate 128 so as to overlap the edge of the encapsulation substrate 128 so that the neutral plane may be lowered in the second non-display area NA2 and the third non-display area NA3. Therefore, in the display devices 700, 800, 900, and 1000 according to various exemplary embodiments of the present disclosure, the third adhesive layer AD3 on the rear surface of the substrate 121, the arrangement area of the seal member 1070 on the upper surface of the barrier film 130 and the substrate 121, the modulus value, and the thickness are adjusted. Therefore, it is possible to reduce the crack of some components which are vulnerable to the stress sharply changed at the edge of the encapsulation substrate 128, such as the substrate 121, the buffer layer 122, the gate insulating layer 123, the passivation layer 124, and the link line LL may be reduced. Further, the reliability of the display devices 700, 800, 900, and 1000 may be improved.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display panel comprising:
a substrate having an active area that display an image and a non-active area that does not display the image;
a pixel unit on a first surface of the substrate in the active area of the substrate, the pixel unit comprising a light emitting element;
an encapsulation layer on the first surface of the substrate, the encapsulation layer covering the pixel unit and disposed in both the active area the non-active area of the substrate;
a support member on a second surface of the substrate that is opposite the first surface of the substrate, the support member overlapping an edge of the encapsulation layer in the non-active area without extending to the active area of the substrate;
a printed circuit board configured to generate a plurality of data signals supplied to the flexible display panel; and
a back cover configured to overlap a rear surface of the flexible display panel, the back cover comprising:
a first portion that includes a plurality of openings, the first portion overlapping the flexible display panel without overlapping the printed circuit board; and
a second portion that lacks the plurality of openings, the second portion overlapping the printed circuit board without overlapping the first portion.

2. The flexible display panel of claim 1, wherein the support member is disposed across the entire non-active area.

3. The flexible display panel of claim 1, further comprising:
a sealing member on the first surface of the substrate, the sealing member in the non-active area of the substrate and surrounding the encapsulation layer.

4. The flexible display panel of claim 3, wherein the support member and the sealing member are made of a same type of material having different Young's modulus.

5. The flexible display panel of claim 4, wherein a Young's modulus of the support member is greater than a Young's modulus of the sealing member.

6. The flexible display panel of claim 3, wherein the pixel unit further comprises a first planarization layer between the light emitting element and the first surface of the substrate, the first planarization layer disposed in both the active area and the non-active area of the substrate,
wherein the support member is disposed in the non-active area of the substrate without overlapping the first planarization layer.

7. The flexible display of claim 6, further comprising:
a buffer layer on the first surface of the substrate, the buffer layer disposed in both the active area and the non-active area of the substrate such that the buffer layer overlaps the edge of the encapsulation layer in the non-active area;
a gate insulation layer on the buffer layer, the gate insulation layer disposed in both the active area and the non-active area of the substrate such that the gate insulation layer overlaps the edge of the encapsulation layer in the non-active area;
a link line on the gate insulation layer, the link line disposed in the non-active area but not the active area such that the link line overlaps the edge of the encapsulation layer, wherein the link line is electrically connected to the light emitting element; and
a passivation layer on the link line, the passivation layer disposed in both the active area and the non-active area of the substrate such that the passivation layer overlaps the edge of the encapsulation layer in the non-active area.

8. The flexible display panel of claim 6, further comprising:
a barrier film on the second surface of the substrate;
a first adhesive layer between the barrier film and the substrate, the first adhesive layer adhering the barrier film to the second surface of the substrate;
a polarizer on the second surface of the substrate and overlapping the barrier film; and
a second adhesive layer between the polarizer and the barrier film, the second adhesive layer adhering the polarizer to the barrier film;
wherein the support member is between the substrate and the first adhesive layer.

9. The flexible display panel of claim 6, further comprising:
a barrier film on the second surface of the substrate; and
an adhesive layer between the barrier film and the substrate, the adhesive layer adhering the barrier film to the second surface of the substrate, wherein the adhesive layer comprises:
a first adhesive portion comprising the support member, the first adhesive portion overlapping the edge of the encapsulation layer in the non-active area without extending to the active area of the substrate; and
a second adhesive portion that is in a same plane as the first adhesive portion, the second adhesive portion non-overlapping with the edge of the encapsulation layer;
wherein a Young's modulus of the first adhesive portion is greater than a Young's modulus of the second adhesive portion.

10. The flexible display panel of claim 9, wherein a first end of the first adhesive portion extends to an edge of the first planarization layer without overlapping the edge of the first planarization layer, and
wherein a second end of the first adhesive portion that is opposite the first end extends to an edge of a second planarization layer without overlapping the edge of the second planarization layer, the second planarization layer in the non-active area and is horizontally spaced apart from the encapsulation layer.

11. The flexible display panel of claim 10, further comprising:
a pad in the non-active area, the pad overlapped by the second planarization layer in the non-active area;
wherein the second planarization layer is spaced apart from the first planarization layer.

12. The flexible display panel of claim 6, further comprising:
a barrier film on the second surface of the substrate, the barrier film comprising:
a first barrier film portion comprising the support member, the first barrier film portion overlapping the edge of the encapsulation layer in the non-active area without extending to the active area of the substrate; and
a second first barrier film portion that is in a same plane as the first barrier film portion, the second first barrier film portion non-overlapping with the edge of the encapsulation layer;
wherein a Young's modulus of the first barrier film portion is greater than a Young's modulus of the second first barrier film portion; and
an adhesive layer between the barrier film and the substrate, the adhesive layer adhering the barrier film to the second surface of the substrate.

13. The flexible display panel of claim 12, wherein a first end of the first barrier film portion extends to an edge of the first planarization layer without overlapping the edge of the first planarization layer, and
wherein a second end of the first barrier film portion that is opposite the first end extends to an edge of a second planarization layer without overlapping the edge of the second planarization layer, the second planarization layer in the non-active area and is horizontally spaced apart from the encapsulation layer.

14. The flexible display panel of claim 13, wherein the first barrier film portion is thicker than the second first barrier film portion.

15. The flexible display panel of claim 14, wherein a portion of the adhesive layer that overlaps the first barrier film portion is thinner than a portion of the adhesive layer that overlaps the second first barrier film portion.

16. The flexible display panel of claim 6, wherein the sealing member extends to overlap both the edge of the encapsulation layer and an upper surface of the first planarization layer.

17. The flexible display panel of claim 3, wherein the sealing member overlaps the support member in its entirety.

18. A rollable display device comprising:
a rollable display panel including:
a substrate having an active area that display an image and a non-active area that does not display the image;
a pixel unit on a first surface of the substrate in the active area of the substrate, the pixel unit comprising a light emitting element;
an encapsulation layer on the first surface of the substrate, the encapsulation layer covering the pixel unit and disposed in both the active area the non-active area of the substrate;
a support member on a second surface of the substrate that is opposite the first surface of the substrate, the support member overlapping an edge of the encapsulation layer in the non-active area without extending to the active area of the substrate;
a roller comprising an outer surface and an inner surface, the roller configured to roll the rollable display panel around the outer surface of the roller into a rolled state, and unroll the rollable display panel from the rolled state to an unrolled state;
a printed circuit board configured to generate a plurality of data signals supplied to the rollable display panel; and
a back cover configured to overlap a rear surface of the rollable display panel, the back cover comprising:
a first portion that includes a plurality of openings, the first portion overlapping the rollable display panel without overlapping the printed circuit board; and
a second portion that lacks the plurality of openings, the second portion overlapping the printed circuit board without overlapping the first portion.

19. The rollable display device of claim 18, wherein the support member is disposed across the entire non-display area.

20. The rollable display device of claim 18, further comprising:
a sealing member on the first surface of the substrate, the sealing member in the non-active area of the substrate and surrounding the encapsulation layer.

21. The rollable display device of claim 20, wherein the support member and the sealing member are made of a same type of material having different Young's modulus.

22. The rollable display device of claim 21, wherein a Young's modulus of the support member is greater than a Young's modulus of the sealing member.

23. The rollable display device of claim 20, wherein the pixel unit further comprises a first planarization layer between the light emitting element and the first surface of the substrate, the first planarization layer disposed in both the active area and the non-active area of the substrate,
wherein the support member is disposed in the non-active area of the substrate without overlapping the first planarization layer.

24. The rollable display device of claim 23, further comprising:
a buffer layer on the first surface of the substrate, the buffer layer disposed in both the active area and the non-active area of the substrate such that the buffer layer overlaps the edge of the encapsulation layer in the non-active area;
a gate insulation layer on the buffer layer, the gate insulation layer disposed in both the active area and the non-active area of the substrate such that the gate insulation layer overlaps the edge of the encapsulation layer in the non-active area;
a link line on the gate insulation layer, the link line disposed in the non-active area but not the active area such that the link line overlaps the edge of the encapsulation layer, wherein the link line is electrically connected to the light emitting element; and
a passivation layer on the link line, the passivation layer disposed in both the active area and the non-active area of the substrate such that the passivation layer overlaps the edge of the encapsulation layer in the non-active area.

25. The rollable display device of claim 23, further comprising:
a barrier film on the second surface of the substrate;
a first adhesive layer between the barrier film and the substrate, the first adhesive layer adhering the barrier film to the second surface of the substrate;
a polarizer on the second surface of the substrate and overlapping the barrier film; and
a second adhesive layer between the polarizer and the barrier film, the second adhesive layer adhering the polarizer to the barrier film;
wherein the support member is between the substrate and the first adhesive layer.

26. The rollable display device of claim 23, further comprising:
a barrier film on the second surface of the substrate; and
an adhesive layer between the barrier film and the substrate, the adhesive layer adhering the barrier film to the second surface of the substrate, wherein the adhesive layer comprises:
a first adhesive portion comprising the support member, the first adhesive portion overlapping the edge of the encapsulation layer in the non-active area without extending to the active area of the substrate; and
a second adhesive portion that is in a same plane as the first adhesive portion, the second adhesive portion non-overlapping with the edge of the encapsulation layer;
wherein a Young's modulus of the first adhesive portion is greater than a Young's modulus of the second adhesive portion.

27. The rollable display device of claim 26, wherein a first end of the first adhesive portion extends to an edge of the first planarization layer without overlapping the edge of the first planarization layer, and
wherein a second end of the first adhesive portion that is opposite the first end extends to an edge of a second planarization layer without overlapping the edge of the second planarization layer, the second planarization layer in the non-active area and is horizontally spaced apart from the encapsulation layer.

28. The rollable display panel of claim 27, further comprising:
a pad in the non-active area, the pad overlapped by the second planarization layer in the non-active area;
wherein the second planarization layer is spaced apart from the first planarization layer.

29. The rollable display device of claim 23, further comprising:
a barrier film on the second surface of the substrate, the barrier film comprising:
a first barrier film portion comprising the support member, the first barrier film portion overlapping the edge of the encapsulation layer in the non-active area without extending to the active area of the substrate; and
a second first barrier film portion that is in a same plane as the first barrier film portion, the second first barrier film portion non-overlapping with the edge of the encapsulation layer;
wherein a Young's modulus of the first barrier film portion is greater than a Young's modulus of the second first barrier film portion; and
an adhesive layer between the barrier film and the substrate, the adhesive layer adhering the barrier film to the second surface of the substrate.

30. The rollable display device of claim 29, wherein a first end of the first barrier film portion extends to an edge of the first planarization layer without overlapping the edge of the first planarization layer, and
wherein a second end of the first barrier film portion that is opposite the first end extends to an edge of a second planarization layer without overlapping the edge of the second planarization layer, the second planarization layer in the non-active area and is horizontally spaced apart from the encapsulation layer.

31. The rollable display device of claim 30, wherein the first barrier film portion is thicker than the first second barrier film portion.

32. The rollable display device of claim 31, wherein a portion of the adhesive layer that overlaps the first barrier film portion is thinner than a portion of the adhesive layer that overlaps the second first barrier film portion.

33. The rollable display device of claim 23, wherein the sealing member extends to overlap both the edge of the encapsulation layer and an upper surface of the first planarization layer.

34. The rollable display device of claim 20, wherein the sealing member overlaps the support member in its entirety.

* * * * *